US012078700B2

(12) United States Patent
Tang et al.

(10) Patent No.: US 12,078,700 B2
(45) Date of Patent: Sep. 3, 2024

(54) SPIN RESONANCE SIGNAL MEASUREMENT USING A MODULATED FICTITIOUS FIELD

(71) Applicant: Regents of the University of Minnesota, Minneapolis, MN (US)

(72) Inventors: Xueyan Tang, Minneapolis, MN (US); Michael Garwood, Minneapolis, MN (US); Steven Suddarth, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 17/689,794

(22) Filed: Mar. 8, 2022

(65) Prior Publication Data

US 2022/0397621 A1   Dec. 15, 2022

Related U.S. Application Data

(60) Provisional application No. 63/158,183, filed on Mar. 8, 2021.

(51) Int. Cl.
  *G01R 33/46*  (2006.01)
  *G01R 33/34*  (2006.01)
  *G01R 33/385*  (2006.01)
  *G01R 33/60*  (2006.01)

(52) U.S. Cl.
  CPC ....... *G01R 33/46* (2013.01); *G01R 33/34092* (2013.01); *G01R 33/385* (2013.01); *G01R 33/60* (2013.01)

(58) Field of Classification Search
  CPC .......... G01R 33/46; G01R 33/34092; G01R 33/385; G01R 33/60
  See application file for complete search history.

(56) References Cited

U.S. PATENT DOCUMENTS

| 5,886,525 A * | 3/1999 | Yesinowski | G01R 33/4641 |
| | | | 324/307 |
| 2007/0188171 A1 * | 8/2007 | Garwood | G01R 33/4616 |
| | | | 324/307 |
| 2007/0188172 A1 * | 8/2007 | Garwood | G01R 33/446 |
| | | | 324/307 |

(Continued)

OTHER PUBLICATIONS

Timo et al.; "MRI Contrast from Relaxation Along a Fictitious Field (RAFF)"; Magnetic Resonance Med.; pp. 1-28 (Year: 2010).*

(Continued)

*Primary Examiner* — Dixomara Vargas
(74) *Attorney, Agent, or Firm* — QUARLES & BRADY LLP

(57) ABSTRACT

Spin resonance spectroscopy and/or imaging is achieved using a system that combines longitudinal (e.g., along the z-axis) detection with a modulated fictitious field generated by a transverse plane (e.g., xy-plane) RF field. Based on z-axis detection of magnetization polarized by this fictitious field as it is modulated (e.g., modulated on and off, or otherwise), spin resonance signals (e.g., EPR, NMR) are measurable with high isolation simultaneous transmit and receive capability. Additionally or alternatively, spin relaxation times can be measured using the described systems.

18 Claims, 9 Drawing Sheets

(56) References Cited

U.S. PATENT DOCUMENTS

| | | | | |
|---|---|---|---|---|
| 2010/0237866 A1* | 9/2010 | Liimatainen | ........... | G01R 33/50 |
| | | | | 324/309 |
| 2010/0264920 A1* | 10/2010 | Witschey | ........... | G01R 33/5605 |
| | | | | 324/309 |
| 2012/0092010 A1* | 4/2012 | Corum | ............... | G01R 33/5601 |
| | | | | 324/309 |
| 2018/0329007 A1* | 11/2018 | Guo | .................... | G01R 33/4616 |
| 2021/0063512 A1* | 3/2021 | Michaeli | ................ | A61B 5/055 |

OTHER PUBLICATIONS

J. Rautiainen et al.; "Adiabatic rotating frame relaxation of MRI reveals early cartilage degeneration in a rabbit model of anterior cruciate ligament transection"; Osteoarthritis and Cartilage; pp. 144-1452 (Year: 2014).*

Alecci et al., Electron Paramagnetic Resonance Spectrometer for Three-Dimensional In Vivo Imaging at Very Low Frequency, Review of Scientific Instruments, 1992, 63(10):4263-4270.

Bouterfas et al., 14 GHz Longitudinally Detected Electron Spin Resonance using MicroHall Sensors, Journal of Magnetic Resonance, 2017, 282:47-53.

Buzug et al., Magnetic Particle Imaging: Introduction to Imaging and Hardware Realization, Zeitschrift für Medizinische Physik, 2012, 22:323-334.

Car et al., Giant Field Dependence of the Low Temperature Relaxation of the Magnetization in a Dysprosium (III)-Dota Complex, Chemical Communications, 2011, 47:3751-3753.

Chiarini et al., Periodic Longitudinal Magnetization of a Spin System Irradiated with Two Transverse Radio-Frequency Waves, Physics Letters, 1973, 44A(2):91-92.

Cohen-Tannoudji et al., A Quantum Calculation of the Higher Order Terms in the Bloch-Siegert Shift, Journal of Physics B: Atomic and Molecular Physics, 1973, 6:L214-L217.

Cole et al., Zero-Filed Electron Magnetic Resonance in Some Inorganic and Organic Radicals, The Journal of Chemical Physics, 1963, 38(12):2915-2924.

Colligiani et al., Longitudinally Detected Pulsed ESR Spectroscopy: Low Power Experiments, 25th Congress Ampere on Magnetic Resonance and Related Phenomena: Extended Abstracts, Springer-Verlag Berlin Heidelberg, 1990, pp. 416-417.

Deatsch et al., Heating Efficiency in Magnetic Nanoparticle Hyperthermia, Journal of Magnetism and Magnetic Materials, 2014, 354:163-172.

Dieckhoff et al., Magnetic-Filed Dependence of Brownian and Neel Relaxation Times, Journal of Applied Physics, 2016, 119:043903, pp. 1-8.

Duncan et al., A 300 Mc/s Electron Spin Resonance Spectrometer, Journal of Scientific Instruments, 1965, 42:395-398.

El'sting, A Device for Investigating Paramagnetic Electronic Resonance at Meter-Band Frequencies, Instruments and Experimental Techniques, 1960, 753-755.

Feher et al., Electron Spin Resonance Absorption in Metals, I, Experimental, Physical Reviews, 1955, 98(2):337-351.

Feher, Sensitivity Considerations in Microwave Paramagnetic Resonance Adsorption Techniques, The Bell System Technical Journal, 1957, 36(2):449-484.

Fuchs et al., Gigahertz Dynamics of a Strongly Driven Single Quantum Spin, Science, 2009, 326:1520-1522.

Garwood et al., Advances in Magnetic Resonance, The Return of the Frequency Sweep: Designing Adiabatic Pulses for Contemporary NMR, Journal of Magnetic Resonance, 2001, 153:155-177.

Goldsborough et al., Influence of Exchange Interaction on Paramagnetic Relaxation Times, Physical Review Letters. 1960, 4(1):13-15.

Granwehr et al., Longitudinally Detected EPR: Improved Instrumentation and New Pulse Schemes, Journal of Magnetic Resonance, 2001, 151:78-84.

Granwehr et al., Measurement of Spin-Lattice Relaxation Times with Longitudinal Detection, Applied Magnetic Resonance, 2001, 20:137-150.

Granwehr, A New Approach to Longitudinally Detected Electron Paramagnetic Resonance, Dissertation Submitted to The Swiss Federal Institute of Technology Zurich, 2002, 171 pages [In Three Parts Due to File Size].

Greenslade et al., Aspects of Low-Frequency Low-Field Electron Spin Resonance, Annual Reports Section "C" (Physical Chemistry), 1995, 92:3-21.

Herve et al., Résonance Paramagnétique—Mesure du Temps de Relaxation T1 Par Modulation du Champ Radiofréquence H1 et Détection de Variation D'aimantation Selon le Champ Director, Comptes Rendus Chimie, 1960, 251:665-667 [No. English Language Translation Available].

Hoult, The Sensitivity of the Zeugmatographic Experiment Involving Human Samples, Journal of Magnetic Resonance, 1969, 34:425-433.

Hutchinson et al., Electron Spin Resonance Spectrometry on the Whole Mouse In Vivo: A 100 MHz Spectrometer, Journal of Physics E: Scientific Instruments, 1971, 4:237-239.

Imagion Biosystems, MagSense® Technology, Retrieved from https://imagionbiosystems.com/our-technology/magsense-technology/#work, Accessed on Mar. 1, 2021, 5 pages.

Ishida et al., In Vivo Analysis of Nitroxide Radicals Injected into Small Animals by L-Band ESR Technique, Physics in Medicine & Biology, 1989, 34(9):1317-1323.

Johnson et al., Nonionizing Electromagnetic Wave Effects in Biological Materials and Systems, Proceedings of the IEEE, 1972, 60(6):692-718.

Lee et al., Static Nuclear Spin Polarization Induced in a Liquid by a Rotating Magnetic Field, Physical Review Letters, 2006, 96:257601, pp. 1-4.

Liimatainen et al., MRI Contrast from Relaxation Along a Fictious Field (RAFF), Magnetic Resonance in Medicine, 2010, 64:983-994.

Lopez et al., Spin-Lattice Relaxation Time Measurements by Pulse and Harmonic Saturation Methods, Physical Letters, 1972, 38A(2):109-110.

Macovski, Noise in MRI, Magnetic Resonance in Medicine, 1996, 36:494-497.

Martinelli et al., Dependence on the Relaxation Times of Longitudinally Detected Paramagnetic Resonance, Solid State Communications, 1975, 17:211-212.

Matheson et al., Paramagnetic Species in Gamma-Irradiated Ice, The Journal of Chemical Physics, 1955, 23(3):521-528.

Nicholson et al., Recent Developments in Combining LODESR Imaging with Proton NMR Imaging, Physics in Medicine & Biology, 1998, 43:1851-1855.

Panagiotelis et al., Electron Spin Relaxation Time Measurements Using Radiofrequency Longitudinally Detected ESR and Application in Oximetry, Journal of Magnetic Resonance, 2001, 149:74-84.

Pescia, La Mesure des Temps de Relaxation Spin-Réseau Tres Courts, Annales de Physique, EDP Sciences, 1965, 13(10): m389-406 [No. English Language Translation Available].

Quaresima et al., Whole Rat Electron Paramagnetic Resonance Imaging of a Nitroxide Free Radical by a Radio Frequency (280 MHZ) Spectrometer, Biochemical and Biophysical Research Communications, 1992, 183(2):829-835.

Roessler et al., Principles and Applications of EPR Spectroscopy in the Chemical Sciences, Chemical Society Reviews, 2018, 47(8):2534-2553.

Roest et al., The Spin-Spin Relaxation Time of Diphenyl Picryl Hydrazyl in Weak Fields, Physica, 1959, 25:1253-1254.

Scheuer et al., Precise Qubit Control Beyond the Rotating Wave Approximation, New Journal of Physics, 2014, 16:093022, pp. 1-13.

Scholes et al., Temperature Dependence of the Electron Spin-Lattice Relaxation Rate from Pulsed EPR of CUA and Heme A in Cytochrome C Oxidase, Biophysical Journal, 1984, 45:1027-1030.

Schweiger et al., Pulsed ESR with Longitudinal Detection, A Novel Recording Technique, Journal of Magnetic Resonance, 1988, 77:512-523.

(56) References Cited

OTHER PUBLICATIONS

Smurugov et al., Radio-Frequency Electron Paramagnetic Resonance of Phase Interaction in Composites, IEEE Journal of Solid-State Circuits, 1989, 25(3):273-276.

Subramanian et al., Radio Frequency Continuous-Wave and Time-Domain EPR Imaging and Overhauser-Enhanced Magnetic Resonance Imaging of Small Animals: Instrumental Developments and Comparison of Relative Merits for Functional Imaging, NMR in Biomedicine, 2004, 17:263-294.

Tang, Ultra-Low Frequency Electron Paramagnetic Resonance Based on Longitudinal Detection and Fictitious Field Modulation, Thesis Submitted to the Faculty of The Graduate School of the University of Minnesota, 2021, 84 pages.

Verstelle et al., The Spin-Spin Relaxation of DPPH in Parallel Fields, Physica, 1960, 26:520-528.

Whitfield et al., Paramagnetic Resonance Detection Along the Polarizing Field Direction, Physical Review, 1957, 106(5), 918-920.

Yakimchenko et al., Diffusion in Porous Catalyst Grains as Studied by EPR Imaging, The Journal of Physical Chemistry, 1995, 99:2038-2041.

Yokoyama et al., A CT Using Longitudinally Detected ESR (LODESR-CT) of Intraperitoneally Injected Nitroxide Radical in a Rat's Head, Magnetic Resonance Imagining, 1997, 15(6):701-708.

Yokoyama et al., In VivoLongitudinally Detected ESR Measurements at Microwave Regions of 300, 700, and 900 MHz in Rats Treated with a Nitroxide Radical, Journal of Magnetic Resonance, 1997, 129:201-206.

Yokoyama et al., In Vivo 300 MHz Longitudinally Detected ESR-CT Imaging in the Head of a Rat Treated with a Nitroxide Radical, Magnetic Resonance Materials in Physics, Biology and Medicine, 1998, 7:63-68.

Yu et al., Magnetic Particle Imaging: A Novel In Vivo Imaging Platform for Cancer Detection, Nano Letters, 2017, 17(3):1648-1654.

Zavoisky, Paramagnetic Relaxation of Liquid Solution for Perpendicular Fields, Journal of Physics—USSR, 1945, 9(3):211-216.

Zavoisky, Spin-Magnetic Resonance in Paramagnetics, Journal of Physics—USSR, 1945, 9(3):211-245.

Zilic et al., Single Crystals of DPPH Grown from Diethyl Ether and Carbon Disulfide Solutions—Crystal Structures, IR, EPR and Magnetization Studies, arXiv preprint arXiv:1202.3620, 2012, 12 pages.

Zweier et al., Measurement of Endothelial Cell Free Radical Generation: Evidence for a Central Mechanism of Free Radical Injury in Postischemic Tissues, Proceedings of the National Academy of Sciences, 1988, 85:4046-4050.

* cited by examiner

SPIN RESONANCE SIGNAL MEASUREMENT USING A MODULATED FICTITIOUS FIELD

CROSS-REFERENCE TO RELATED APPLICATIONS

This application claims the benefit of U.S. Provisional Patent Application Ser. No. 63/158,183, filed on Mar. 8, 2021, and entitled "SPIN RESONANCE SIGNAL MEASUREMENT USING A MODULATED FICTITIOUS FIELD," which is herein incorporated by reference in its entirety.

STATEMENT REGARDING FEDERALLY SPONSORED RESEARCH

This invention was made with government support under EB025153 awarded by the National Institutes of Health. The government has certain rights in the invention.

BACKGROUND

The possibility of longitudinal detection ("LOD") of electron paramagnetic resonance ("EPR") signals has been previously described. Instead of measuring the transverse magnetization, LOD measures the longitudinal magnetization along the polarizing field direction. By placing the receive coil orthogonal to the transmit coil and tuning it to a different frequency range, an LOD EPR system can have superior resilience against transmit crosstalk and noise. However, due to relatively low sensitivity in the common EPR frequency range, its application was originally confined to studying relaxation times.

SUMMARY OF THE DISCLOSURE

The present disclosure addresses the aforementioned drawbacks by providing a method for measuring spin resonance signals generated by a spin isochromat. A fictitious polarizing field is generated along an axis by transmitting a radio frequency (RF) field in a plane with an RF transmit coil. The fictitious polarizing field has a field strength determined by a carrier frequency and amplitude of the RF field, a relaxation time of the spin isochromat, and a gyromagnetic ratio of the spin isochromat, where generating the fictitious polarizing field polarizes the spin isochromat along a direction perpendicular to the plane in which the RF field is transmitted. Spin resonance signal data are acquired with an RF receive coil by modulating the fictitious field while measuring spin resonance signal generated from a change of longitudinal magnetization of the spin isochromat along the direction perpendicular to the transverse plane.

It is another aspect of the present disclosure to provide a spin resonance measurement system. The system includes a first transmit radio frequency (RF) coil extending in a first direction; a second transmit RF coil extending in a second direction that is perpendicular to the first direction; and a receive RF coil extending in a third direction that is perpendicular to both the first direction and the second direction. The first transmit RF coil and the second transmit RF coil are arranged relative to the receive RF coil such that when operated the first transmit RF coil and second RF transmit coil generate an RF field in a volume measurable by the receive RF coil. The system also includes an RF subsystem in communication with the first transmit RF coil, the second RF transmit coil, and the receive RF coil. The RF subsystem is configured to operate the first transmit RF coil and the second transmit RF coil to transmit an RF field in order to generate a fictitious polarizing field in the volume measurable by the receive RF coil, where the fictitious polarizing field has a field strength determined by a carrier frequency and amplitude of the RF field, a relaxation time of a selected spin isochromat, and a gyromagnetic ratio of the selected spin isochromat; modulate the fictitious field by adjusting at least one of the field strength or the carrier frequency of the RF field; and detect with the receive RF coil, spin resonance signals generated by the spin isochromat while the fictitious field is being modulated.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
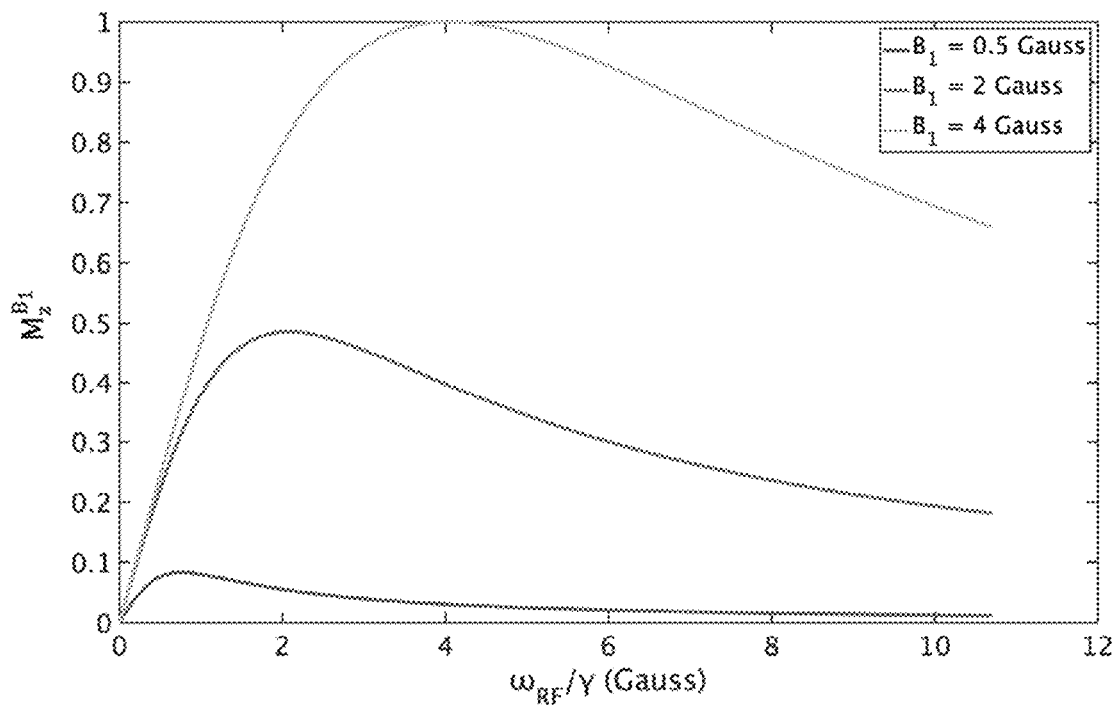
FIG. 1 shows a plot of the relative $M_z^{B_1}$ polarized by the fictitious field, dependence on carrier frequency for three different RF field strengths, at $B_0=0$, as predicted from the modified Bloch-equation simulations.

Described here are systems and methods for spin resonance spectroscopy and/or imaging. Spin resonance can refer to electron spin resonance, such as in electron paramagnetic resonance ("EPR"), or nuclear spin resonance, such as in nuclear magnetic resonance ("NMR") and magnetic resonance imaging ("MRI"). Thus, the systems and methods described in the present disclosure are applicable to EPR, NMR, MRI, and other spin resonance spectroscopy and/or imaging applications. In general, the systems and methods described in the present disclosure utilize longitudinal detection ("LOD") and fictitious-field modulation in order to provide continuous wave ("CW") spin resonance for spectroscopy and/or one-dimensional ("1D") imaging applications.

As will be described below, the systems and method described in the present disclosure can be implemented for a number of different applications. As one example, the systems and methods can be used for spin relaxation time measurements. In these instances, the systems and methods can be used for characterizing material properties, model simulations (e.g., hyperthermia efficiency simulations), detecting whether a drug carrier is combined to a target, or the like. Advantageously, the systems and methods provide for a low-field (e.g., less than 10 Gauss) system capable of measuring short and ultrashort relaxation times from fast decaying signals.

As another example, the systems and methods can be used for concentration calibration. For instance, the systems and methods can be used for measuring material concentration both in vivo and in vitro. Advantageously, the systems and methods described in the present disclosure are able to enable calibration of material concentration (e.g., iron-oxide nanoparticle concentration in cryopreserved organs or otherwise) using a portable, low-cost system with higher sensitivity than currently available measurement systems.

As still another example, the systems and methods can be used for imaging and spectroscopy, as described in detail below. Advantageously, the systems enable spin resonance imaging and spectroscopy at lower gradient strengths than currently available systems while still achieving comparable resolution.

In yet other examples, the systems and methods can be used for dosimetry applications. In these instances, the signal from free radicals can be detected post treatment in order to measure the delivered dose. Additionally or alternatively, the systems and methods can be used for hyperthermia applications (e.g., for cancer treatment in a clinical setting, or for heating materials, media, or other objects in an industrial settings).

In general, the systems and methods described in the present disclosure are operable without the need for a magnet and instead can use a transverse plane (e.g., xy-plane) radio frequency ("RF") field alone to polarize spins along the perpendicular, longitudinal direction (e.g., the z-axis). Instead of measuring transverse magnetization, this LOD measures the longitudinal magnetization along the polarizing field direction. As an example, by placing the receive coil orthogonal to the transmit coil and tuning it to a different frequency range, an LOD-based system can realize a significant resilience against transmit cross-talk, which can enable simultaneous transmit and receive. As a result, the signals from spins with short relaxation times (e.g., EPR signals) can be recorded with high signal-to-noise ratio.

When viewed in a rotating frame of reference, a transverse-plane RF field manifests as a longitudinal field component called the fictitious field. By modulating the RF field, and thus the fictitious field, detectable longitudinal magnetization patterns are measurable. In other words, the fictitious field polarizes spin isochromats along a direction that is perpendicular to the plane of the RF transmit coil that is used to transmit the RF field that results in the polarizing fictitious field. This technique is described in terms of a fictitious field along the z-axis in the rotating frame. Based on z-axis detection of the longitudinal magnetization caused by this fictitious field as it is modulated (e.g., modulated on and off, or otherwise), spin resonance signals (e.g., EPR, NMR) are measurable. Because the frequencies of the RF field and z-axis modulation can be set to significantly different values (e.g., MHz versus KHz, respectively), large isolation (e.g., 80 dB or better) between RF transmitter ("Tx") and receiver ("Rx") signals can be achieved.

By varying a small static field along the z-axis, spin resonance (e.g., EPR, NMR) spectra can be detected and used to measure the properties of magnetic materials and molecules. Also, by applying a magnetic field gradient, spin resonance (e.g., EPR, MRI) imaging of magnetic materials and molecules (e.g., iron-oxide nanoparticles ("IONPs")) can be performed using simultaneous transmit and receive ("STAR") with high Tx/Rx isolation. Additionally, the systems and methods described in the present disclosure can be used to provide increased efficiency for inductive RF heating as used, for example, in magnetic fluid hyperthermia.

Unlike a conventional EPR imaging system, there is no large $B_0$ field in the systems described in the present disclosure. For instance, the systems can utilize a $B_0$ field having a very small field strength, such as around 10 Gauss (24 MHz), which is significantly smaller than the GHz frequencies used for conventional EPR techniques. In this way, the systems described in the present disclosure can be less expensive to construct because a larger $B_0$ field does not need to be generated. In some embodiments, the system can operate without the need for a $B_0$ field.

Coils (e.g., quadrature Helmholtz coils) are used to generate a $B_1$ field, which may be a linearly or circularly polarized $B_1$ field, as the transmit field. The fictitious field $\Delta B_z'$, or $B_{fict}$, that results from $B_1$ is described below with respect to Eqn. (4). The fictitious field can be modulated, such by turning $B_1$ on and off. With the receive coil positioned along the z-axis, the change in z-axis magnetization caused by the fictitious field modulation can be measured. In some configurations, a pair of Helmholtz coils can be used to create a polarizing field, $B_0$, for measuring sample spectra, or a gradient field used for imaging.

When doing imaging (e.g., 1D imaging), the Helmholtz coil pair can be driven separately to create a spatial-encoding gradient along the z-axis. Maximum signal occurs at the position where the fictitious field is cancelled by the z-gradient field. The amplitude of the signal is proportional to the spin density at that position. By shifting the gradient field, the resonance position can be moved and the spin density can again be measured. This process can be repeated to achieve imaging.

Additionally or alternatively, the systems and methods described in the present disclosure can allow for measuring relaxation time(s). Advantageously, the systems and methods described in the present disclosure are capable of measuring ultrashort relaxation times (e.g., relaxation times on the order of a few nanoseconds or shorter) at very low field strength (e.g., several Gauss) and/or frequency (e.g., on the order of a few MHz). As a non-limiting example, the systems can be used to measure ultrashort relaxation times (e.g., using Eqn. (8)) of materials like IONPs and others that have ultrashort relaxation times (e.g., relaxation times on the order of 1 ns). As an example, measuring the relaxation times can be used to provide relaxometry to differentiate bound IONPs on cancer cells. As another example, the systems can be used to provide calibration of different materials with short relaxation times, such as IONPs. For instance, IONPs can be measured to identify how their relaxation time varies with field strength. This enables the IONPs to be calibrated prior to their use in a clinical application. As still another example, the systems can be used to provide EPR distance measurements, which make use of the measured relaxation time to determine the distance between spin-labeled proteins or other spin-labeled compounds.

Advantageously, the systems and methods described in the present disclosure can operate at lower frequencies than conventional EPR systems. As such, the systems described in the present disclosure can enable the detection of spins at these lower frequencies, which would otherwise be difficult for existing EPR systems due to fast spin relaxation.

Because the systems and methods described in the present disclosure provide for acceptable spatial resolution with significantly lower $B_0$ fields than are used in existing systems, they enable low cost, portable, in-vivo spin resonance (e.g., EPR, NMR) imaging systems, especially for spins with short relaxation times such as IONPs. They may also be used to measure particle properties, serving as a low-cost spectrometer.

Advantageously, by using one or more sensitive magnetometers, such as a superconducting quantum interference device ("SQUID"), to detect the spin resonance signals, it is possible to bring about signal-to-noise ratio ("SNR") improvements for systems operating at ultralow and/or zero $B_0$ field.

As noted above, the systems and methods described in the present disclosure can provide a significant isolation between transmit and receive coils. In this way, the systems described in the present disclosure can be operable in a STAR mode because of this high-level of isolation between the transmit coil and the receive coil. When implementing STAR, transmit/receive ("T/R") switching and associated transients can be eliminated or otherwise significantly reduced. By making use of an RF field with frequency much smaller than 1 GHz and an easily attainable field strength, and by enabling acceptable resolution, the systems and methods described in the present disclosure can enable low cost, portable EPR (or other magnetic resonance) spectrometers and/or imaging systems, especially for spins with short relaxation times such as IONPs.

In traditional CW EPR systems, receiver isolation is not adequate for simultaneous transmit and receive. Conventional CW EPR imaging systems use an RF bridge and a circulator that isolates the transmit and receive arms of the bridge. When there is an impedance match between the resonant cavity and the source arms of the bridge, there will be no reflection of RF power from the cavity. When resonance absorption takes place, the impedance is altered and leads to a reflection of a small amount of power, which reaches the diode detector via the circulator. The receiver isolation is about −25 dB. The systems described in the present disclosure make use of geometrical isolation and frequency separation instead. For instance, the receive coil can be perpendicular to the transmit coils, and the transmit carrier frequency can be tuned to different values than the receive frequency, such as a transmit carrier frequency of 28 MHz and a receive frequency of 235 kHz. These two features enable a receiver isolation of about −80 dB, which is a measurable improvement over the −25 dB achieved with conventional CW EPR imaging systems.

As noted above, the systems and methods described in the present disclosure can also be used in magnetic nanoparticle hyperthermia applications. For instance, the manner in which the spins (i.e., magnetization) are modulated is different and more efficient than conventional approaches of using a linearly polarized coil for inductive heating, thereby resulting in an improved heat generating efficiency relative to traditional techniques.

To describe the modulation of the fictitious field and its effect on generating measurable spin resonance signals, a derivation of the fictitious field from the modified Bloch equation is first provided. The standard Bloch equation assumes that spins seek alignment with the static field $B_0$ via relaxation. Although appropriate for the large $B_0$ values at which EPR is commonly performed, this is not applicable for ultra-low frequency LOD EPR applications. When the RF field, $B_1$, strength is comparable to the static field strength, the longitudinal relaxation occurs along the field that is the vector sum of $B_0$ and $B_1$. Failing to modify the relaxation term accordingly causes deviation in the prediction of the magnetization components. In the extreme case of $B_0$ approaching zero, the standard Bloch equation predicts $M_z=0$ in the steady state even with the existence of an RF field on the XY-plane.

Advantageously, a transverse-plane, circularly polarized RF field alone can lead to a stable $M_z$. This can be understood by picturing the magnetization initially aligned along the RF field direction. When the RF field rotates, the magnetization cannot instantaneously realign with the RF field and the resulting angle between them causes the magnetization to rotate around the transverse RF field, resulting in a stationary Z-magnetization. Therefore, when the polarizing field $B_0$ is not significantly larger than the RF field strength, it may be preferable to calculate the relaxation term based on the vector sum of all fields. Doing so leads to a more general form of the Bloch equation, the modified Bloch equation:

$$\frac{\partial M}{\partial t} = \gamma M \times B - \frac{M - M_{eq}}{\tau}; \quad (1)$$

where M is the magnetization vector in A/m; $M_{eq}$ is the equilibrium magnetization vector that equals to $\chi B/\mu$, where $\chi$ is the dimensionless volume susceptibility and $\mu$ is the permeability in H/m; $\gamma$ is the gyromagnetic ratio, in rad/s/T, of a spin isochromat (e.g., electrons for EPR, hydrogen protons or other nuclei for NMR and/or MRI) from which spin resonance signals are to be generated; B is the total magnetic field vector in T (a vector sum of all magnetic fields); and $\tau$ is the relaxation time constant in s. The spin-spin relaxation time can be assumed to be equal with the spin-lattice relaxation time, as is expected in general at low fields.

For a longitudinal detection setup, signal is caused purely or primarily by the change in $M_z$. As a result, the expression of the Z-magnetization is focused on and the transverse magnetization neglected in the following derivations.

In this example derivations, a small Z-axis polarizing field $B_0$ and a circularly polarized RF field in the XY-plane having constant amplitude and carrier frequency are first assumed. In the steady state, the solution of the modified Bloch equation yields the following expression for the longitudinal magnetization, $$M_z = \frac{(\Delta\omega\tau)(\gamma B_1\tau)\chi B_1/\mu + [1+(\Delta\omega\tau)^2]\chi B_0/\mu}{1+(\Delta\omega\tau)^2+(\gamma B_1\tau)^2}; \quad (2)$$

where $B_1$ is the RF field strength, $B_0$ is the polarizing field strength, $\Delta\omega$ is the off-resonance frequency that equals $\omega_0-\omega_{RF}$, where $\omega_0$ is the Larmor frequency ($\omega_0=\gamma B_0$) and $\omega_{RF}$ is the carrier frequency of the RF field in rad/s. The left-hand definition of rotation is used in this example.

For comparison, the longitudinal magnetization derived from the standard Bloch equation is, $$M_z = \frac{[1+(\Delta\omega\tau)^2]\chi B_0/\mu}{1+(\Delta\omega\tau)^2+(\gamma B_1\tau)^2}. \quad (3)$$

By comparing Eqns. (2) and (3), it can be seen that the steady state $M_z$ is different due to an additional term in the numerator of Eqn. (2) that relates to RF field strength and its frequency. When $B_0 \gg B_1$ and the RF irradiation is near the resonance frequency, the $M_z$ obtained from the modified Bloch equation simplifies to the conventional one. However, when $B_0$ is not substantially larger than $B_1$ and the irradiation frequency is different from the Larmor frequency, $\omega_0=\gamma B_0$, the modified Bloch equation should be used to more accurately determine the longitudinal magnetization. As such, the modified Bloch equation better describes the low frequency systems and methods described in the present disclosure.

The longitudinal magnetization can be divided into two parts: one part that arises from $B_0$ and the rest that arises from the RF field. As stated above, a detectable longitudinal signal is produced when a modulation of $M_z$ is produced. In the systems and methods described in the present disclosure, $M_z$ modulation from RF field manipulation is implemented in lieu of changing $B_0$.

To help conceptualize how $M_z$ is affected by the RF field changes, an RF-induced fictitious field can be introduced to account for the effect of the RF field alone. In the steady state, the amplitude of the fictitious field equals the Z-axis static field that would produce the same amount of longitudinal magnetization as the RF field. Thus, the fictitious field can be defined as, $$B_{fict} = -\frac{\omega_{RF}/\gamma}{1+\left(\left(\frac{\Delta\omega}{\gamma}\right)/B_1\right)^2 + \left(\left(\frac{1}{\gamma\tau}\right)/B_1\right)^2}. \quad (4)$$

By multiplying the RF-induced fictitious field by the coefficient $\chi/\mu$, the longitudinal magnetization caused by the RF field can readily be obtained. By using a fictitious-field framework, it can be seen that, even when $B_0=0$, there is non-zero $M_z$ resulting from the RF field. When changing the RF field properties, the fictitious field is changed, which leads to the change in $M_z$ and thus the longitudinal signal. This fictitious field can qualify as a figure-of-merit for the longitudinal magnetization caused by the RF field. Unlike the fictitious fields described in previous magnetic resonance literature, which arise from coordinate frame rotation, whereas the fictitious field described in the present disclosure accounts for relaxation and RF field strength.

When $B_1 \gg |\Delta\omega/\Gamma|$ and $B_1 \ll 1/\gamma\tau$, the second and third terms in the denominator of Eqn. (4) can be neglected, and $B_{fict}$ can be simplified to, $$B_{fict} = -\frac{\omega_{RF}}{\gamma}. \quad (5)$$

When the RF field strength is sufficient to meet the asymptotic condition above, multiplying $B_{fict}$ by the coefficient $\chi/\mu$ yields the RF-induced longitudinal magnetization, $$M_z^{B_1} = -\frac{\chi}{\mu}\frac{\omega_{RF}}{\gamma}. \quad (6)$$

According to Eqn. (4), $B_{fict}$ depends on the amplitude and frequency of the RF field. There is a positive correlation between $B_{fict}$ and $B_1$. To obtain the relationship between $B_{fict}$ and $\omega_{RF}$ for fixed $B_1$, the derivative with respect to $\omega_{RF}$ can be calculated:

$$\frac{\partial B_{fict}}{\partial \omega_{RF}} = -\frac{\gamma^2(B_1^2+B_0^2)+\frac{1}{\tau^2}-\omega_{RF}^2}{\gamma^3 B_1^2\left(1+\left(\left(\frac{\Delta\omega}{\gamma}\right)/B_1\right)^2+\left(\left(\frac{1}{\gamma\tau}\right)/B_1\right)^2\right)}; \quad (7)$$

from which it can be shown that a local extremum for $B_{fict}$ occurs when $$|\omega_{RF}|=\sqrt{\gamma^2(B_1^2+B_0^2)+1/\tau^2} \quad (8).$$

Again, at the frequencies commonly used in conventional EPR, $\gamma B_1$ and $1/\tau$ are negligible compared to $\gamma B_0$. Under these conditions, the $\omega_{RF}$ setting to produce a local extremum of $B_{fict}$ can be simplified to $|\gamma B_0|$, which is the familiar "on-resonance" condition in conventional EPR and NMR.

For the extreme case when no static polarizing field exists (e.g., $B_0=0$) and assuming $1/\tau \ll \gamma B_1$, the maximum fictitious field amplitude and thus $M_z$ amplitude occurs when $|\omega_{RF}/\gamma|=|B_1|$. Plots in FIG. 1 show the longitudinal magnetization as a function of $|\omega_{RF}/\Gamma|$ for three different settings of $|B_1|$, with $B_0=0$ in all cases. In these simulations of the modified Bloch equation, the relaxation time is set to 1 μs, which makes $1/\tau$ insignificant relative to all $\gamma B_1$ values used. The peak positions for all three curves agree well with predictions based on the analytical solution derived above (Eqn. (8)).

Having described the derivation of the fictitious field from the modified Bloch equation, example techniques for modulating the fictitious field are now described.

At a fixed setting of $\omega_{RF}$, $B_{fict}$ can be made to vary periodically by modulating the amplitude of $B_1$. One way to accomplish this is to turn an on-resonant RF drive field on and off. When the RF field is on, the amplitude of the fictitious field is given by:

$$|B_{fict}| = \frac{\omega_{RF}/\gamma}{1+\left(\left(\frac{1}{\gamma\tau}\right)/B_1\right)^2}. \tag{9}$$

When the RF field is turned off, the amplitude of the fictitious field is zero. Thus, by turning the RF field turned on and off, the fictitious field switches between the value in Eqn. (9) value and zero.

Sinusoidal modulation can also be used for amplitude modulation. As an example, the time-dependent fictitious field of a sine-modulated RF field can be written as:

$$B_{fict} = \frac{\omega_{RF}}{\gamma}\frac{B_1^2\sin^2(\omega_{mod}t)}{B_1^2\sin^2(\omega_{mod}t)+1/(\gamma\tau)^2}. \tag{10}$$

Similarly, when the amplitude of the RF field is fixed, the frequency of the RF field can be modulated to achieve fictitious modulation. As a non-limiting example, a chirp pulse can be used as a frequency modulated pulse: its amplitude is fixed and its frequency changes linearly with time within each pulse duration. Assuming the center frequency of the frequency sweep is the Larmor frequency $\omega_0$, the pulse duration is $T_p$, and the sweeping bandwidth is $\Delta\omega$, the frequency profile of a chirp pulse can be written as:

$$\omega_{RF}(t) = \omega_0 - \frac{1}{2}\Delta\omega + \frac{\Delta\omega}{T_p}t. \tag{11}$$

At the beginning of the pulse, the carrier frequency of the RF field is $$\omega_0 - \frac{1}{2}\Delta\omega,$$

while at the end of the pulse, the carrier frequency is $$\omega_0 + \frac{1}{2}\Delta\omega.$$

Substituting the frequency profile of the chirp pulse into Eqn. (4), the time-dependent fictitious field can be represented as:

$$B_{fict} = -\frac{\frac{\omega_0 - \frac{1}{2}\Delta\omega + \frac{\Delta\omega}{T_p}t}{\gamma}}{\left(\left(\frac{-\frac{1}{2}\Delta\omega+\frac{\Delta\omega}{T_p}t}{\gamma}\right)/B_1\right)^2 + \left(\left(\frac{1}{\gamma\tau}\right)/B_1\right)^2 + 1}; \tag{12}$$

which is symmetric about the center frequency over the course of one pulse duration.

For frequency-swept RF fields, such as a hyperbolic secant ("HS") pulse, both its frequency profile and field strength are time-variant, $$B_1(t) = B_1^{max}\,\text{sech}(\beta(2t/T_p-1)) \tag{13};$$

$$\omega_{RF}(t)-\omega_c = A\tan h(\beta(2t/T_p-1)) \tag{14};$$

where $A$ and $\beta$ are real constants, $B_1^{max}$ is the maximum RF field strength, $\omega_c$ is the center frequency in the bandwidth of interest, and $T_p$ is the pulse duration. In this case, the time-dependent fictitious field can be calculated as, $$B_{fict}(t) = -\frac{\left(\frac{\omega_c + A\tanh(\beta(2t/T_p-1))}{\gamma}\right)}{\left(1+\left(\frac{A\tanh(\beta(2t/T_p-1))}{\gamma B_1^{max}\text{sech}(\beta(2t/T_p-1))}\right)^2 + \left(\frac{1}{\gamma\tau B_1^{max}\text{sech}(\beta(2t/T_p-1))}\right)^2\right)}. \tag{15}$$

According to Eqn. (15), the fictitious field produced by an HS pulse is time dependent and symmetric about $\omega_c/\gamma$ over the course of one pulse duration. As before, the longitudinal component of the total effective field can be calculated from the vector sum of the fictitious field $B_{fict}$ and the polarizing field $B_0$. Because $B_{fict}$ is time dependent in these instances, Eqn. (15) is valid when assuming short relaxation time and slow passage execution. Based on the local extremum noted by Eqn. (8), when keeping the other parameters fixed and acquiring a frequency-swept spectrum, the spectral peak shifts away from the Larmor frequency, and the shift distance is directly related to the spin relaxation time.

As described above, the modified Bloch equation can be applied to understand magnetization behavior in an ultralow frequency range. A description of how the principles underlying the creation and optimization of longitudinal magnetization signal from fictitious-field modulation is now provided. In one example, discrete time integration of the modified Bloch equation can be used to calculate the temporal dependence of $M_z$.

Figures 2A, 2B, 2C, 2D:
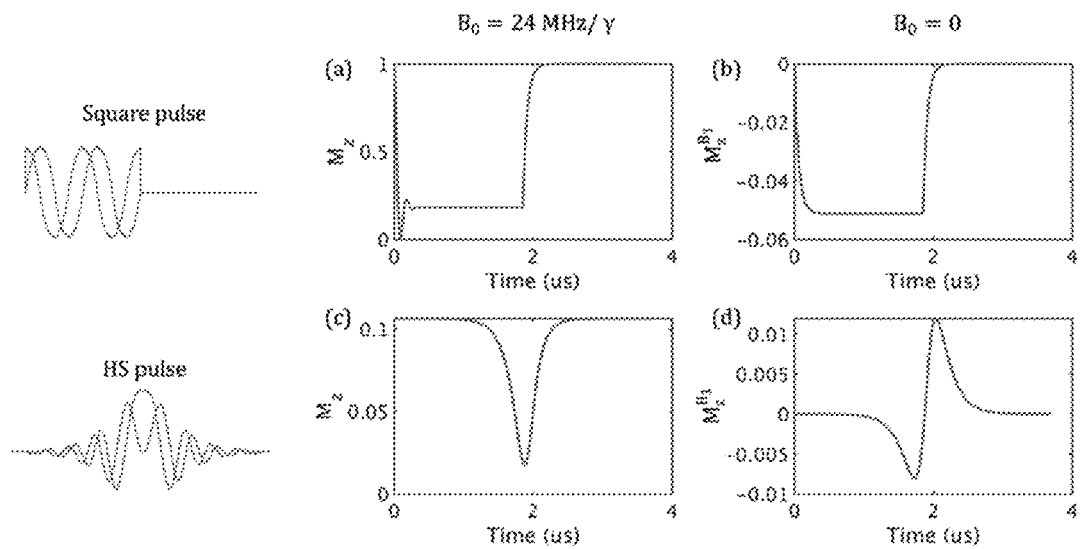
FIGS. 2A-2D show steady state longitudinal magnetization patterns obtained with fictitious field modulation at $\gamma B_0=24$ MHz (a, c) and $\gamma B_0=0$ (b, d), when using a square pulse (a, b) or a frequency-swept HS pulse (c, d). These results are obtained from the modified Bloch equation simulations.

At least two different approaches can be used for generating periodic longitudinal magnetization patterns. One is to amplitude modulate an RF field with fixed carrier frequency, and the second one is to use a frequency-swept RF field. FIGS. 2A-2D illustrate example magnetization patterns created by these two different pulse sequences in the steady state, with and without a longitudinal polarizing field. In these plots, the longitudinal magnetization is plotted as a function of time covering one repetition time ("TR") period. FIGS. 2A and 2B show simulation results for turning on and off a 24 MHz square pulse at 270 kHz modulation frequency, of which the square pulse is on for half of the time. FIGS. 2C and 2D show the same for an HS pulse that sweeps a bandwidth of 24 MHz around the resonant frequency (i.e., for the cases, $\gamma B_0=0$ or 24 MHz) and has a duration equal to the TR. The on-resonance condition is satisfied in FIGS. 2A and 2C ($B_0=24$ MHz/$\gamma$), while the zero-field case is shown in FIGS. 2B and 2D. The RF field amplitude is set to 1.9 Gauss throughout the simulations shown in FIGS. 2A-2D and the spin relaxation time is set to 60 ns. These example parameters were chosen according to experimental plans and hardware configurations. In all four cases, there were repeatable longitudinal magnetization patterns when the spins reach steady state.

Because the change in the amplitude of the longitudinal magnetization is the source of signal for the systems and methods described in the present disclosure, here the factors affecting $\Delta M_z$ are described. As discussed above, when an on-resonant square pulse is turned on and off, $\Delta M_z$ equals the change of the fictitious field multiplied by the coefficient $\chi/\mu$:

$$|\Delta M_z| = \frac{\chi}{\mu}|\Delta B_{fict}| = \frac{\chi}{\mu}\frac{\omega_{RF}/\gamma}{1+\left(\left(\frac{1}{\gamma\tau}\right)/B_1\right)^2}. \quad (16)$$

From Eqn. (16), it can be seen that $|\Delta M_z|$ keeps increasing with stronger RF field strength until reaching a plateau equal to $\chi\omega_{RF}/\gamma\mu$. When $|\Delta M_z|$ is 80% of the plateau value, $B_1$ can be calculated as, $$B_1 = \frac{2}{\gamma\tau}; \quad (17)$$

which is independent of $\omega_{RF}$. When $B_0=0$, the $B_1$ needed to achieve 80% of the plateau $|\Delta M_z|$ can be derived from similar analysis:

$$B_1 = 2\sqrt{\left(\frac{\omega_{RF}}{\gamma}\right)^2 + \left(\frac{1}{\gamma\tau}\right)^2}. \quad (18)$$

Figure 3:
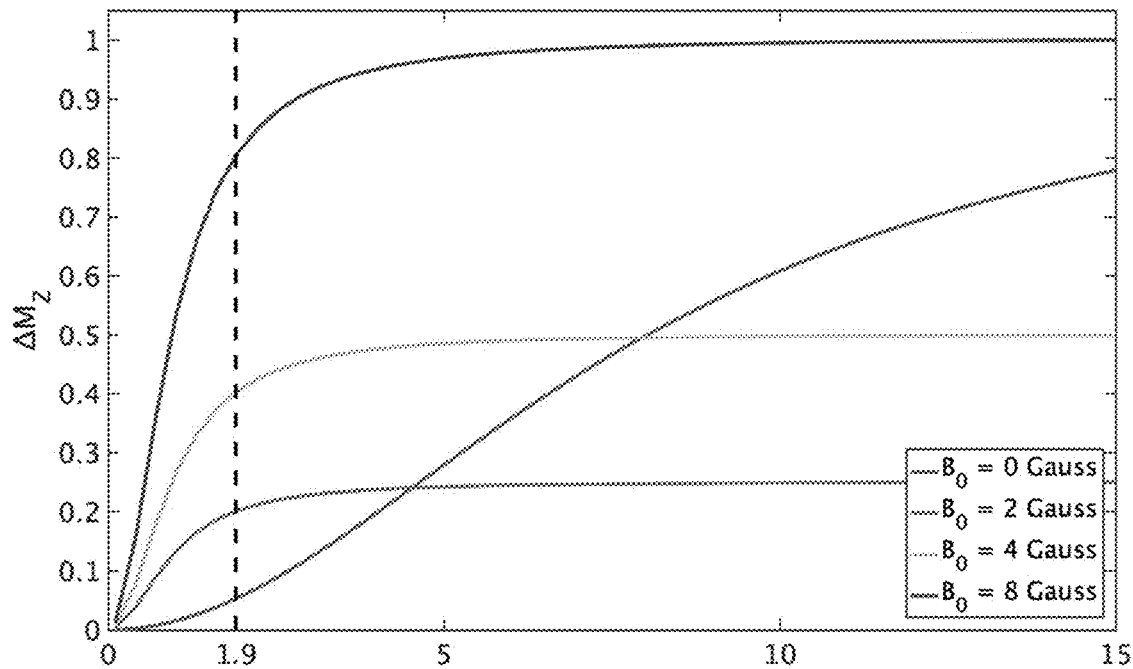
FIG. 3 shows plots of $|\Delta M_z|$ as a function of the RF field strength $B_1$ for different polarizing field strengths $B_0$. The dashed line indicates the $B_1$ value where 80% of the plateau $|\Delta M_z|$ value is reached for cases with $B_0 \neq 0$.
Figures 4A, 4B, 4C, 4D:
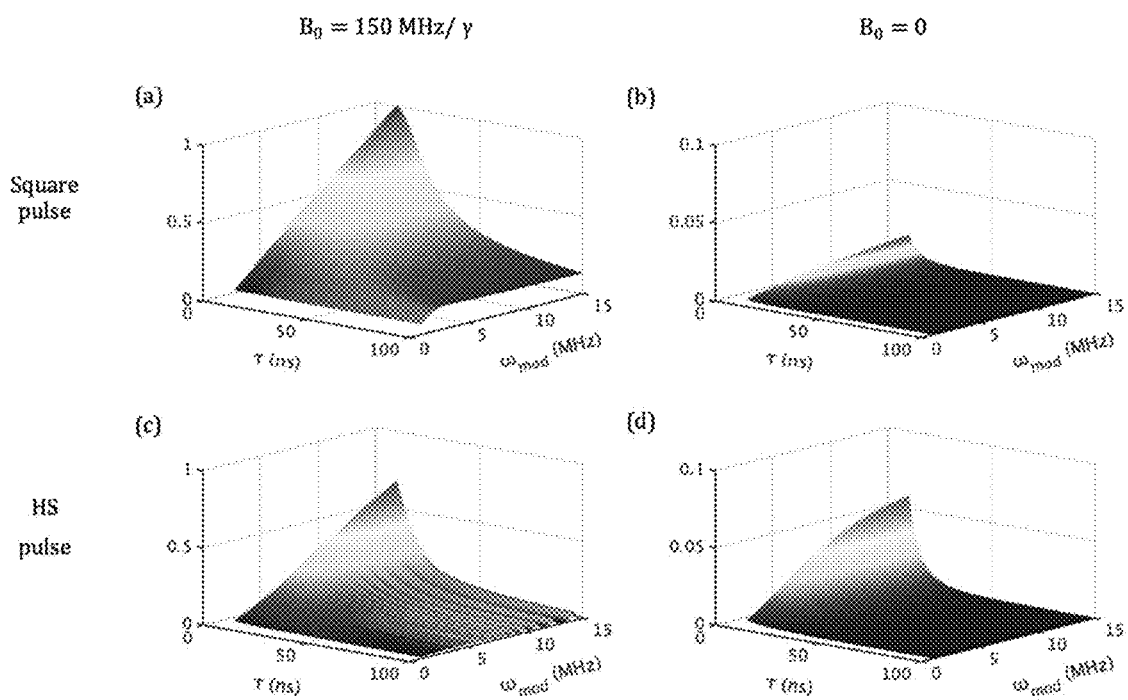
FIGS. 4A-4D show relative signal energy as a function of the modulation frequency of the fictitious field and the relaxation time of the spin isochromat, with and without $B_0$, in the case of square-pulse modulation (a, b) or HS-pulse modulation (c, d), using RF field strengths optimized for the square pulse. These results are obtained from modified Bloch equation simulations.

FIG. 3 shows plots of the normalized $|\Delta M_z|$ as a function of $B_1$ for the case of a circularly polarized field that is amplitude modulated (square pulse), at four different $B_0$ values. The calculations used to generate the results in FIG. 3 were performed with $\tau$ set to 60 ns, which is a reported relaxation time of 2,2-diphenyl-1-picrylhydrazyl ("DPPH"). Three of the curves are from on-resonant RF fields, and the carrier frequency of each is equal with $\gamma B_0$. For all three of these curves, $|\Delta M_z|$ reaches 80% of the plateau value when $B_1$ is around 1.9 Gauss. As for the curve corresponding to $B_0=0$, its carrier frequency was set to be the same as that of the on-resonant RF field at $B_0=8$ Gauss, which makes its plateau value (not shown) close to that of the $B_0=8$ Gauss case. The $B_1$ value needed to reach 80% of the plateau value in this example was calculated to be approximately 16 Gauss, almost 10-times bigger than the 1.9 Gauss required for $B_0 \neq 0$ cases, and that difference keeps increasing as $\omega_{RF}$ increases. For $B_0=0$, the $|\Delta M_z|$ value can be comparable to those values attained with $B_0 \neq 0$, but experimental factors, such as the lowest carrier frequency required for a certain modulation frequency and the achievable RF field strength, may in practice limit the longitudinal signal at $B_0=0$ to be significantly smaller than that at $B_0 \neq 0$.

For optimal sensitivity, the detection circuit can be tuned to the modulation frequency of the fictitious field. As a result, only the longitudinal signal at the modulation frequency $\omega_{mod}$ needs to be considered when calculating the signal energy per unit time:

$$E = \omega_{mod} \int_0^{1/\omega_{mod}} \frac{dM_z}{dt} e^{-j\omega_{mod}t} dt; \quad (19)$$

which is valid at any value of $B_0$. The optimal modulation frequency $\omega_{op}$ can be defined as the $\omega_{mod}$ value that, according to Eqn. (19), will result in the maximum signal energy per unit time in the steady state. At non-zero values of $B_0$, the value of $\omega_{RF}$ of an on-resonant square pulse will have negligible effect on the $\omega_{op}$. Thus, $\omega_{op}$ is only a function of $B_1$ and $\tau$. The optimal modulation frequency, $\omega_{op}$, is proportional to $1/\tau$ for fixed $B_1$ between 0.5 and 10 Gauss and $\tau$ between 10 and 100 ns. The slope and y-intercept can be determined by $B_1$. For instance, when turning the square pulse on and off, $$\omega_{op} = f(B_1)/\tau + g(B_1) \quad (20);$$

where $f(B_1)$ and $g(B_1)$ are $B_1$-dependent functions, $B_1$ is in unit of Gauss, $\tau$ is in s, and $\omega_{op}$ is in Hz.

As a non-limiting example, to estimate $f(B_1)$ and $g(B_1)$ for the square pulse, a set of simulations of $\omega_{op}$ were performed with different RF field strengths and spin relaxation times. Both $f(B_1)$ and $g(B_1)$ could be represented by fourth degree polynomials:

$$f(B_1) = 6.6 \times 10^{-5} \times B_1^4 - 1.9 \times 10^{-3} \times B_1^3 + 1.8 \times 10^{-2} \times B_1^2 - 0.05 \times B_1 + 0.24 \quad (21);$$

$$g(B_1) = -2.4 \times 10^3 \times B_1^4 + 7.2 \times 10^4 \times B_1^3 - 7.2 \times 10^5 \times B_1^2 + 3.5 \times 10^6 \times B_1 - 1.3 \times 10^6 \quad (22);$$

The polynomial equation for $\omega_{op}$ is helpful for determining the optimal $\omega_{mod}$ for $\tau$ between 10 and 100 ns and $B_1$ between 0.5 and 10 Gauss, when amplitude-modulating to create a sequence of square pulses.

In practice, additional considerations may influence the choice of a modulation frequency. For example, to generate the required optimal RF field strength of 1.9 Gauss, a high quality-factor ("Q") resonator may be used to attain the requisite RF power levels, which in turn may limit the modulation bandwidth at the same time. On the other hand, more power can be delivered into a lower Q resonator, but that additional power may cause sample heating problems if the additional power is dissipated in the coil. In some instances, a modulation frequency that is optimized for signal amplitude may produce additional line broadening. In these instances, when recording an EPR spectrum or image, a compromise between sensitivity and resolution may be used to favor a modulation frequency below the signal optimum.

FIGS. 4A-4D show the relationship between the signal energy, modulation frequency, and relaxation time, with and without a polarizing field, for the cases of square pulse and frequency-swept HS pulse. The simulation parameters are similar to those used to generate FIGS. 2A-2D, except the resonant frequency is raised up to 150 MHz in FIGS. 4A and 4C to investigate a wider modulation frequency range. The sweeping bandwidth of the HS pulse was set to be 150 MHz to keep the absolute change in $B_{fict}$ the same as that produced by the square pulse. The signal energy per unit time can be obtained from Eqn. (19), with $B_1$ set to the optimal value at each $\tau$, for the case of the amplitude-modulated (square) pulse. For $\tau$ between 10 and 100 ns, the optimal $B_1$ varied between ~1 to ~10 Gauss. In this example, the HS pulse used parameters optimized for the square pulse. In all cases in this example, the maximum obtainable signal energy per unit time increased as $\tau$ decreased. The relaxation time of DPPH can be ~60 ns while that of IONP can be around 10 ns; thus, a higher signal intensity may be achievable from IONP in optimal situations.

Figures 5A, 5B, 5C:
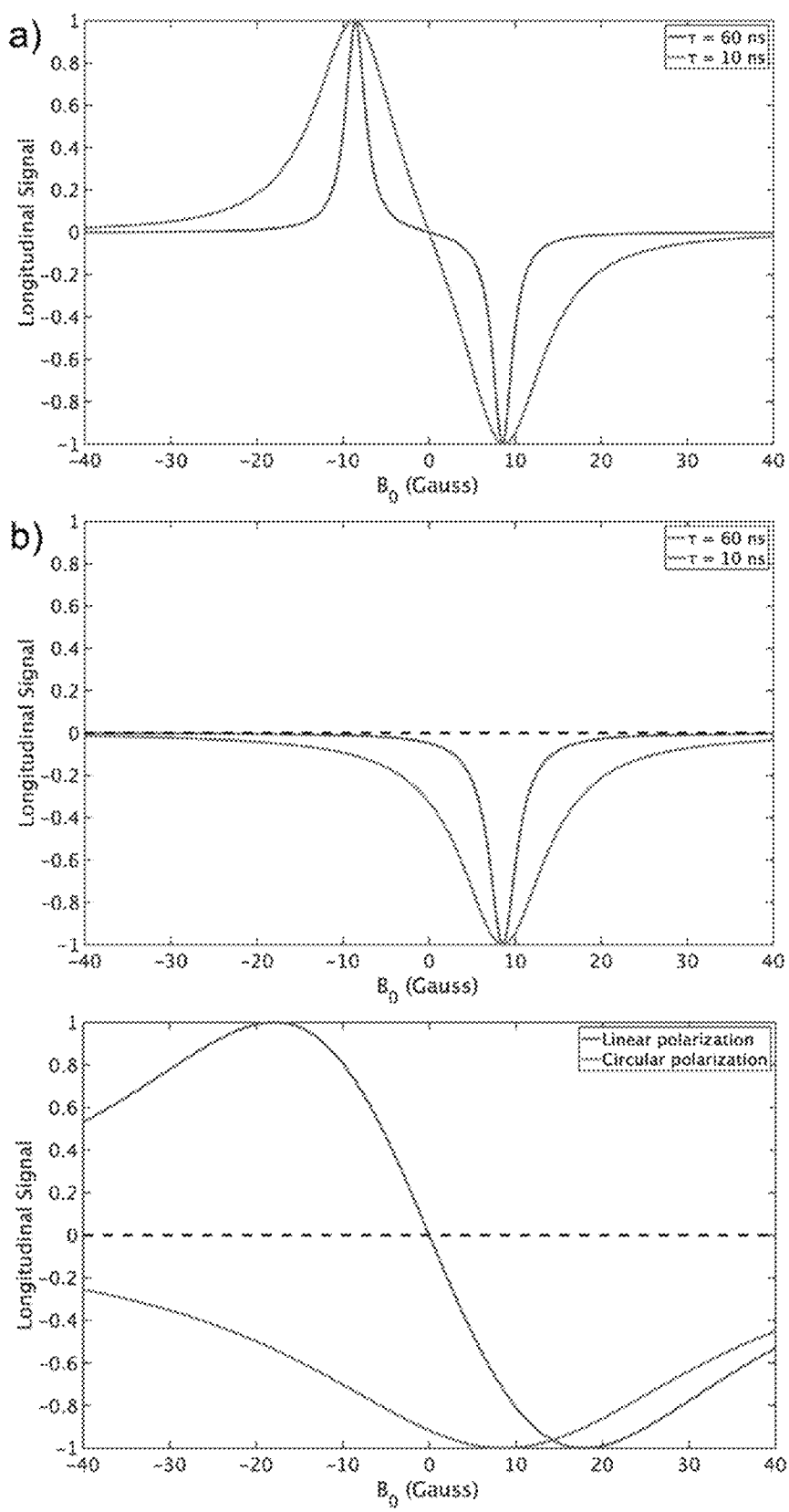
FIGS. 5A-5C show simulated spectra using linearly-versus circularly-polarized RF fields, for different values of the relaxation time, $\tau$. (a) Linearly-polarized RF field with $\tau=10$ ns and 60 ns. (b) Circularly-polarized RF field with $\tau=10$ ns and 60 ns. (c) Linearly-versus circularly-polarized RF fields, with $\tau=1$ ns, which allows the peak shift from the resonant field strength produced with linearly-polarized RF to be apparent.

Spectral acquisition (e.g. LOD EPR spectral acquisition) with the systems described in the present disclosure entails measuring the steady-state signal along the longitudinal axis, at each value of a sequentially stepped $B_0$. Simulated LOD-EPR spectra, as predicted by the modified Bloch equation, are shown in FIGS. 5A-5C. In this example, different τ values were used to investigate its effect on the spectral linewidth. The simulations of this experiment used square-pulse modulation (i.e., $B_1$ turned on and off at frequency $\omega_{mod}$). Since the receive circuit may record the Fourier transform of the averaged time-domain signal at the modulation frequency, the relative signal energy can be calculated using Eqn. (19). FIGS. 5A and 5B show the simulated spectra for τ=10 and 60 ns when using a linearly polarized square pulse (FIG. 5A) or a circularly polarized square pulse (FIG. 5B). The peak signal occurred when the fictitious field was anti-parallel to $B_0$ and had the maximum amplitude when the RF field was on. Because $B_0$ is being swept instead of $\omega_{RF}$, the derivative of $B_{fict}$ with respect to $B_0$ reveals that the maximum $B_{fict}$ occurs when $\gamma B_0 = \omega_{RF}$ for a circularly polarized RF field, similar to the on-resonance situation in conventional EPR.

In both plots, the square pulse is turned on and off at 270 kHz and its carrier frequency is fixed at 24 MHz. The RF field strength was set to 2 Gauss throughout the experiment. All curves were normalized to their maximum value to maintain the same scale, and their peaks occur around the $B_0$ value that is expected, at $\omega_{RF}/\gamma$. There are two peaks in FIG. 5A because the linearly polarized field has two counter-rotating circularly polarized components. As $B_0$ approaches zero, the two counter-rotating components may not be sufficiently separated. The process by which an off-resonance counter-rotating field component influences a spectral peak can be described by the Bloch-Siegert shift. Analytical solutions for the Bloch-Siegert shift are available, which have dependency on only two parameters: the RF field strength and the static field Larmor frequency.

FIG. 5C shows simulated spectra obtained with a linearly and circularly polarized RF field using a short r of 1 ns and the same $\omega_{RF}$ and $B_1$ values as in FIGS. 5A and 5B. In FIG. 5C, there is significant peak shift in the linearly-polarized case while the peak position of the circularly-polarized case remains at ~8.5 Gauss.

Figure 6:
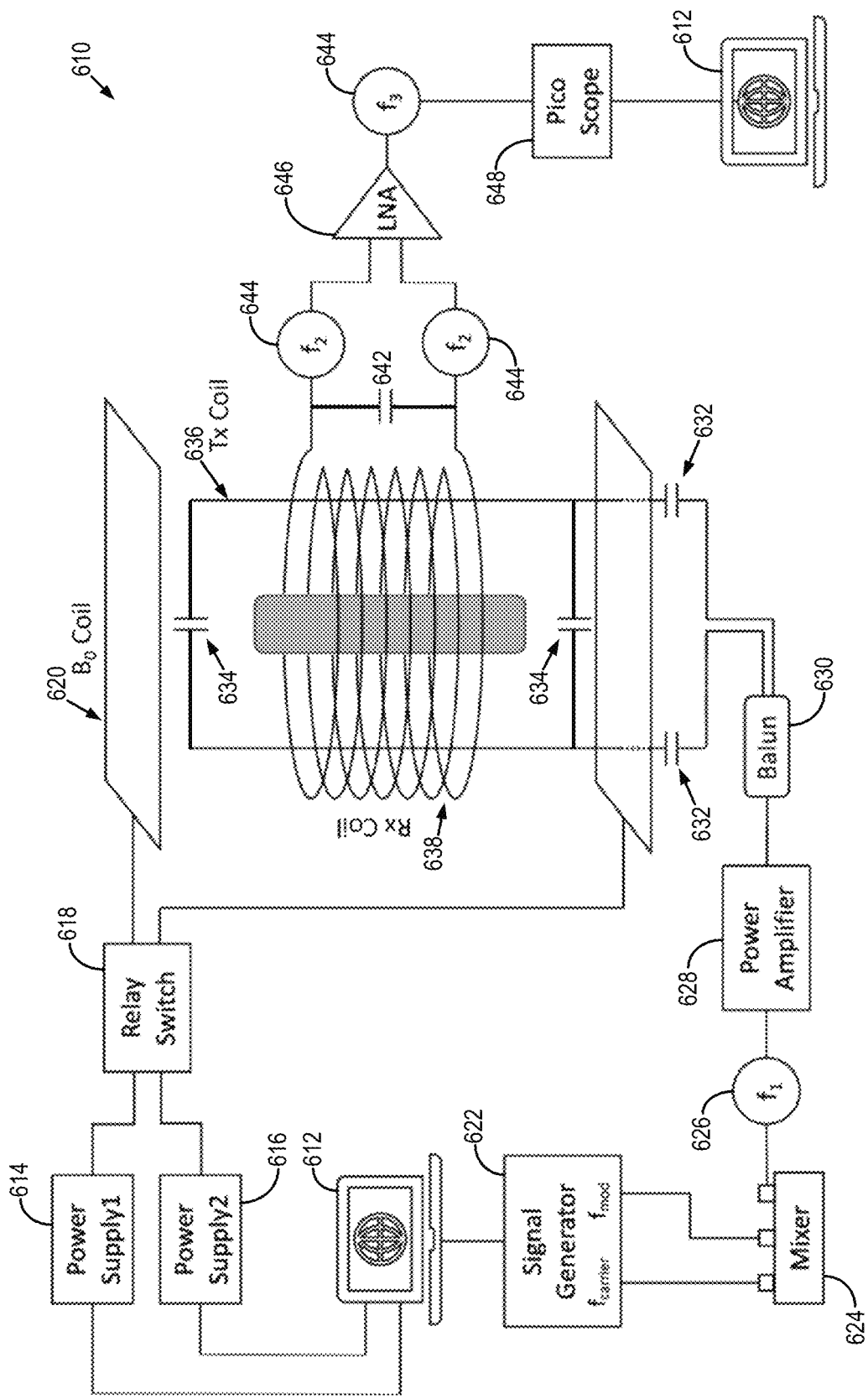
FIG. 6 is a block diagram of an example LOD EPR system that contains three main parts: $B_0$/gradient coil circuit (2-5), transmit coil circuit (6-13), and detection circuit (15-20). 1. Computer, 2 & 3. Power supply (Siglent Technologies SPD1168X), 4. Industrial relay controller (NCD ProXR), 5. Home-built Helmholtz coils pair to provide $B_0$/gradient field, 6. Waveform generator (Rigol DG992), 7. Double balanced mixer (Mini-Circuits ZAY-3+), 8. Connectorized bandpass filter (Mini-Circuits ZABP-16+), 9. Power amplifier (Mini-Circuits LZY-22+), 10. Ferrite balun (Würth Elektronik WE-STAR-TEC), 11. Matching capacitors, 12. Resonating capacitors, 13. 3D-printed copper tape transmit coil, optional 90 degree quadrature channel omitted for clarity, 14. Sample, 15. 3D-printed receive coil, 16. Tuning capacitor, 17. Connectorized low pass filter (Mini-Circuits BLP-5+), 18. Preamplifier (SRS SIM911), 19. Connectorized low pass filter (Mini-Circuits BLP-1.9+), 20. 12-16 bit oscilloscope (PicoScope 4224).

A block diagram of an example system 610 for spin resonance (e.g., EPR, NMR, MRI) spectroscopy and/or imaging that implements fictitious-field modulation is shown in FIG. 6. The spin resonance system 610 includes three main parts: a $B_0$/gradient coil circuit, a transmit coil circuit, and a detection circuit. Most of the electronic components are programmable and can be remotely controlled via a local network, which facilitates the automation of the experimental procedure.

In general, the $B_0$/gradient coil circuit includes a computer system 612, a first power supply 614, a second power supply 616, a relay switch 618, and a $B_0$ coil 620 (e.g., a Helmholtz coli pair configured to provide an adjustable magnetic field strength). The transmit coil circuit generally includes a waveform generator 622, mixer 624 (e.g., a double balanced mixer), a bandpass filter 626 (e.g., a connectorized bandpass filter), a power amplifier 628, a ferrite balun 630, matching capacitors 632, resonating capacitors 634, and a transmit coil 636. In some instances, the transmit coil 636 may include a coil composed from 3D printed copper tape and made include an optional 90-degree quadrature channel. The detection circuit can generally include a receive coil 638 that is sized, shaped, or otherwise dimensioned to receive a sample 640, a tuning capacitor 642, one or more lowpass filters 644 (e.g., connectorized lowpass filters), a preamplifier 646, and an optional oscilloscope 648 (e.g., a 12-16 bit oscilloscope).

Z-axis static fields are generated by a pair of coils 620, which as one example may be 100-turn coils using 18 AWG enameled copper wire. In a non-limiting example, the coils can be arranged in an approximate Helmholtz configuration with a wire bundle centroid diameter of 14 cm and a spacing of 10 cm. An industrial relay controller 618 (NCD ProXR) can be used for switching the field direction generated by the coil pair 620 under sequence control. When measuring sample spectra, the same current can be directed into both coils 620, resulting in a homogeneous magnetic field throughout the sample area. When conducting 1D imaging, the two coils 620 can be controlled separately to generate a fixed gradient strength with an adjustable direct current ("DC") component.

As one example, the transmit coil 636 can be made of 1-inch wide copper tape wrapped around a ~10 cm long coil base. The transmit coil 636 can be shaped as a long rectangle to create a uniform field over a sample with 4.3 mm inner diameter and a length that is several times longer than the diameter. Via tuning the matching capacitors 632 and the resonating capacitors 634, an example transmit coil 636 can resonate at 24 MHz and have a Q-factor of 44. In other configurations, the spin resonance system can be operated at other frequencies, such as between 2-10 MHz. In some configurations, circularly-polarized RF fields can be used. In other configurations, linear polarization can be used. Although a linearly-polarized RF field is associated with odd-function images around zero field, with enough static field, the image separation is sufficient for imaging and spectroscopy.

The modulated transmit waveform can be programmed using a waveform generator 622, such as a Rigol DG992 waveform generator. One channel of the waveform generator 622 can output a sine wave at the carrier frequency while the second channel can output a waveform at the modulation frequency. After passing through a double balanced mixer 624 (Mini-Circuits ZAY-3+), the resultant waveform is a 24 MHz sine wave modulated at the desired frequency. The modulated waveform is then amplified by an RF amplifier 628, such as a 30 W broadband-power RF amplifier (Mini-Circuits LZY-22+), and directed into the transmit coil 636. A ferrite balun 630 can be used to convert to balanced drive to reduce RF currents in the experimental chassis.

Signal is received by a receive coil 638, which in one non-limiting example may be a 140-turn, ~6 cm diameter Litz-wire coil wound on a 3D-printed base. This example receive coil 638 has a capacitor-tuned frequency around 270 kHz, an inductance of 1.08 mH, and a loaded Q-factor of 14. Low pass filters (Mini-Circuits BLP-5+) can be used to eliminate signal energy at unwanted frequencies throughout the detection circuit. The output of the receive coil 638 is fed to a low noise differential amplifier 646 (SRS SIM911), which may be done at a gain of 100. After amplification, the signal is collected by a 12-bit high-resolution oscilloscope 648 (PicoScope 4224) and sampled at a frequency, such as a frequency of 5 MHz continuously for one or two seconds at a time, then transformed into the frequency domain.

Figure 7A:
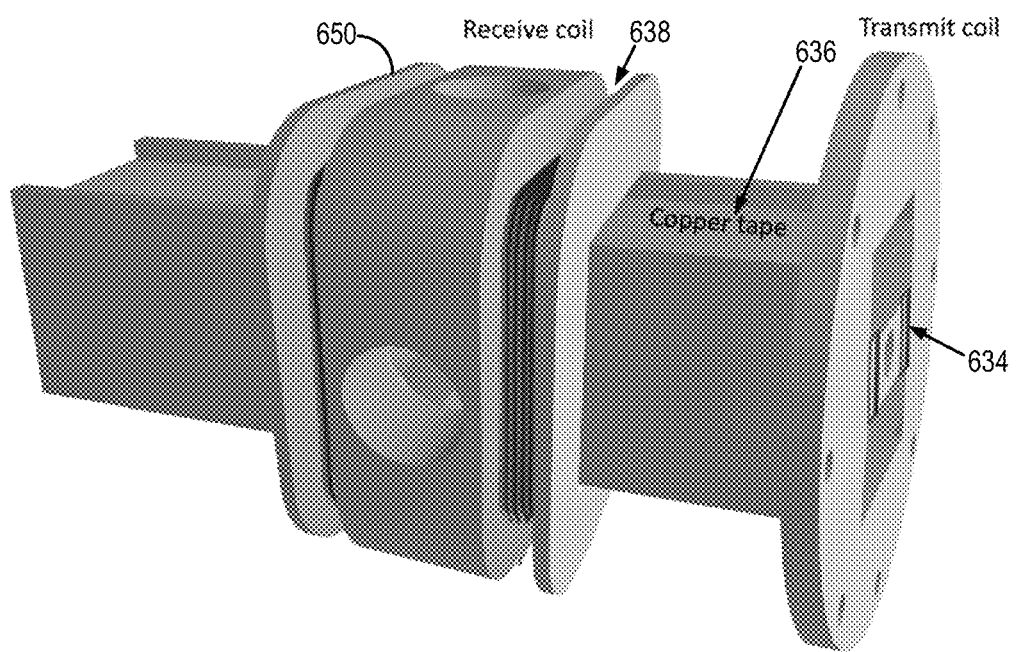
FIG. 7A is an example coil assembly showing a transmit coil and a receive coil arranged on a 3D-printed base.

The coil bases for both transmit and receive coils can be 3D printed and fixed in a position that provides symmetry and orthogonality, with a through-bore hole in the center to accommodate a 5 mm NMR tube. The routing of coil wires can be arranged to cancel or minimize (transmit/receive) coupling. An example of 3D-printed transmit and receive coils is shown in FIG. 7. In this example, the transmit and receive coils are arranged 90 degrees to each other on a 3D-printed base 650. As described above, in this example the transmit coil 636 is composed of copper tape.

The system can be sensitive to amplifier second harmonic distortion, which may cause a spectral line at the carrier modulation frequency that would compete directly with the desired signal. This leakage can be minimized by balancing the coil capacitively as well as inductively. In some instances, leakage caused by the non-linearity in the system can be decreased using virtual grounding. Resonating capacitors can be split on both ends of the transmit coil and the junctions between the capacitors capacitively coupled to the base plate of the system. Copper shields can also be applied to cover the coils for further leakage reduction.

As noted above, the spin resonance system can be configured with a transmit coil that operates at the MHz range, while the receive coil operates in the kHz range. The combination of geometrical isolation and frequency separation leads to a minimum leakage level in the system while doing simultaneous transmit and receive. For instance, with the receive coil orthogonal to the transmit coil, geometrical isolation is near perfect. The combination of geometrical isolation and frequency separation leads to minimum leakage level in the system.

In one example setup, the carrier frequency (transmit frequency) is set to ~24 MHz while the modulation frequency (receive frequency) is set to ~270 kHz.

In another example setup, the static polarizing field was set at two different values for two different experiments: 1 Gauss and 1.8 Gauss. In other configurations, the static polarizing field can be set at other values, such as other values between 1 and 2 Gauss (e.g., 1 Gauss, 1.2 Gauss, 1.4 Gauss, 1.6 Gauss, 1.8 Gauss, 2 Gauss, or the like), or other magnetic field strengths suitable for performing spectroscopy or measuring spin relaxation of the spins of interest. In an example setup, the carrier frequency of the RF field was swept through a range of values in some instances, such as between 2 and 8 MHz, during which the RF field was amplitude modulated at 48 kHz with the maximum value kept at 0.4 Gauss. In this same example setup, the receive coil was tuned to the fictitious field modulation frequency of 48 kHz. The Larmor frequency for 1 and 1.8 Gauss polarizing field strengths were 2.8 and 5 MHz, respectively; while the peaks of the measured spectra were at 5.1 and 6.2 MHz, respectively. The relaxation time calculated from the spectral peak shift was 37 ns at 1 Gauss and 40 ns at 1.8 Gauss.

Figure 7B:
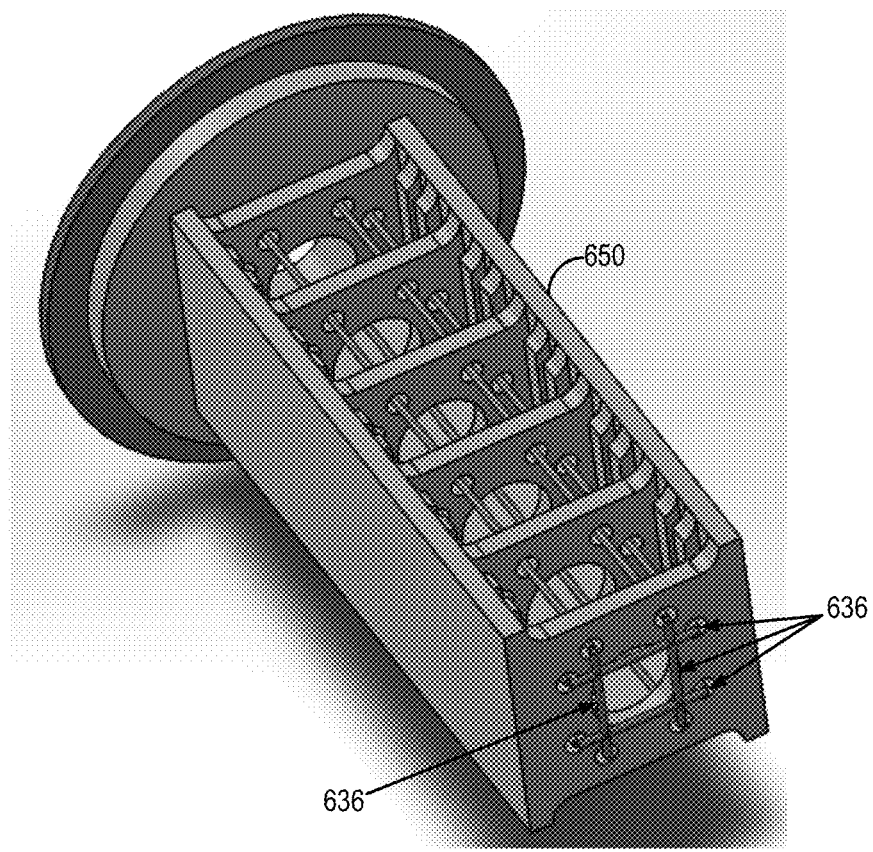
FIG. 7B is an example of an alternative transmit coil configuration arranged on a 3D-printed base.

In some configurations, the spin resonance measurement system 610 can be configured to measure relaxation times. In these configurations, the transmit circuit may be modified to transmit a broadband frequency sweep rather than using a fixed carrier frequency. The transmit coil 636 may also be modified for applications in relaxation time measurement. For example, as shown in FIG. 7B, a transmit coil 636 may be constructed using wires arranged in U-shaped configurations on a 3D-printed base, such as the 3D printed base 650 described above or a similarly constructed 3D-printed base. As a non-limiting example, four 18-AWG wires with enamel insulation were bent in U-shape and inserted through the 3D-printed coil base 650. The short section of the U-shape is ~18 mm and the long section of the U-shape is ~113 mm. Each pair of the wires corresponds to a transmit channel, which enables the transmit coil to deliver circularly or linearly polarized RF fields. To keep the wires straight, five PCB boards cut with holes can be attached to the coil base to hold the wires in position. There is a 10 mm diameter hole at the center of the coil base as well as the PCB boards to accommodate the sample holder.

Figure 8:
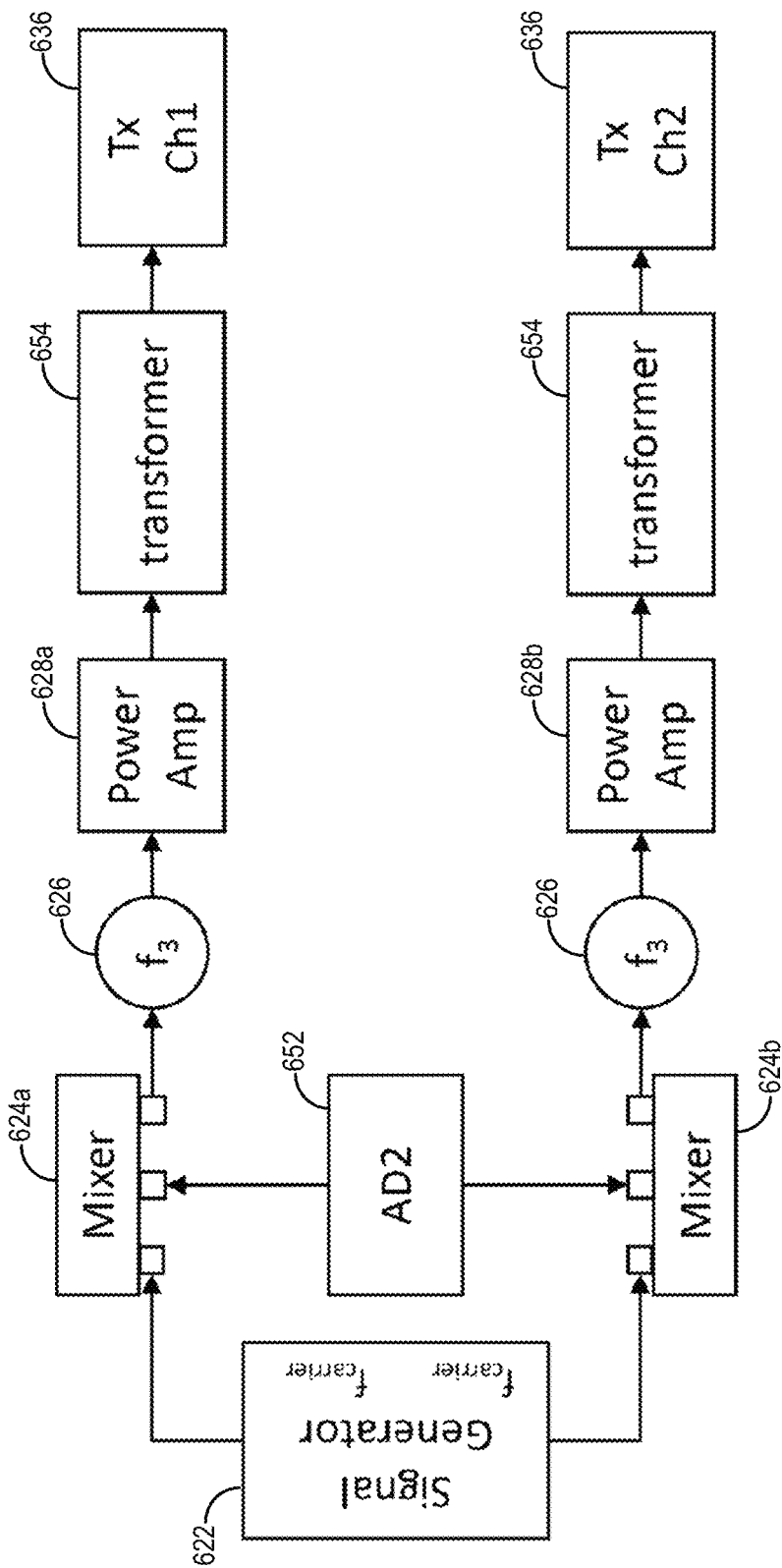
FIG. 8 is a block diagram of an example broadband sweep transmit circuit.

In an example implementation of the relaxation time measurement system, experimental settings of 2 Gauss $B_0$ and 0.5 Gauss $B_1$ were used. The carrier frequency of the RF field was swept between 4 and 10 MHz. An example of a broadband frequency sweep transmit circuit used in the relaxation time measurement configuration of the system 610 is shown in FIG. 8. Both channels of the waveform generator 622 generate the sine wave at desired carrier frequency, with 90 degree phase shift between each other, and then are directed to the input of two mixers, 624a and 624b, separately. One channel of an oscilloscope 652 (e.g., a DigilentAnalog Discovery) can be used to generate a square wave at the modulation frequency (e.g., ~100 kHz). This square wave is split into two identical waveforms using a TEE connector and directed to the second input of the two mixers 624a and 624b. The resultant waveforms are two sine waves turned on and off at 100 kHz, with 90 degree phase difference. After being amplified by two broadband power amplifiers 628a and 628b (e.g., 30 W broadband power amplifiers), both channels are connected to transformers 654 (e.g., CCI RF2000 transformers) and then to the channels of the transmit coil 636.

Figure 9:
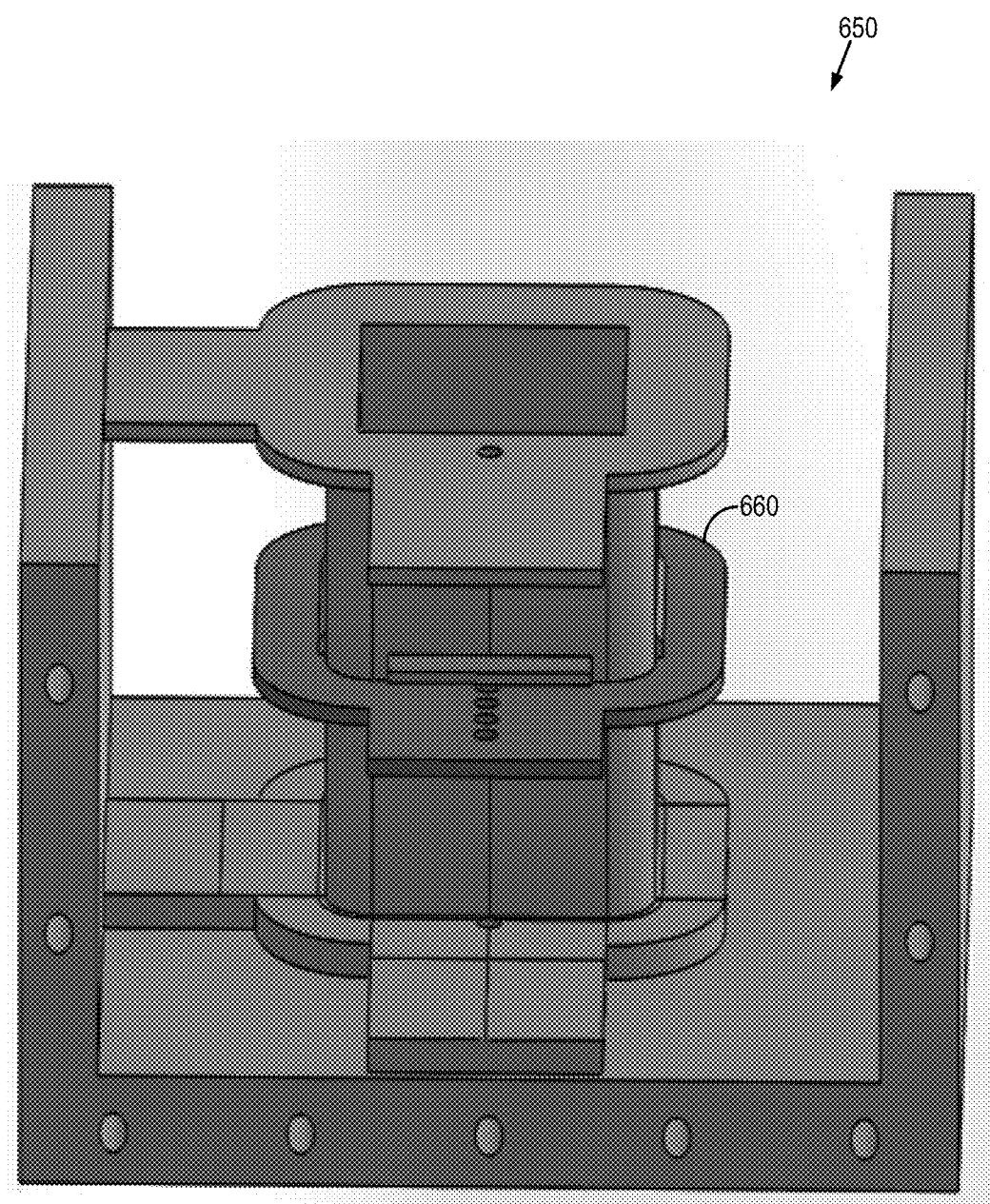
FIG. 9 is an example of an alternative 3D-printed base support for a receive coil.

As shown in FIG. 9, the 3D-printed base 650 for the receive coil 638 can also be adapted, whether for use in a spin measurement or relaxation time measurement configuration of the system 610. For instance, a better anchoring system can be used to reduce vibrations. A center PCB 660 can also be used to ground the middle of the receive coil 638 (not shown in FIG. 9) to the base plates. In some configurations, to make up for the lowered detection frequency (100 kHz), the length of the coil base can be increased to 10 cm and 300 turn Litz wires can be used. The Q-factor of this receive coil 638 configuration is 12, comparable to the one that was used in the spectroscopy system.

In one example study, the modulation of the fictitious field was investigated at zero polarizing field with DPPH and IONPs. The coil pair for generating the longitudinal static field in this example was also used to cancel out the Earth's magnetic field, along with a careful orientation of the entire apparatus so that only one axis is required for cancellation. A 24 MHz circularly polarized pulse was modulated to create detectable longitudinal signal.

Separate 5 mm NMR tubes were filled with 3 cm of polycrystalline DPPH powder (Sigma Aldrich) and 2 cm of IONP gel (Imagion Biosystems) at a concentration of 1 mg Fe/ml. Fast Fourier transformation ("FFT") of the received time-domain signal showed a peak at the modulation frequency (set to 277 kHz in this experiment) for both samples when they were inserted into the center of the receive coil, which demonstrated the effectiveness of the fictitious field in driving spins.

In LOD imaging, spatial resolution is limited by the full width half maximum ("FWHM") of the spectral linewidth. Hence, in an example study, DPPH and IONP spectra were acquired to evaluate the gradients used for spatial encoding.

When amplitude modulating with a square pulse, maximum longitudinal signal occurs when the fictitious field cancels out the longitudinal polarizing field. For spectroscopy experiments, the carrier frequency was set at 24 MHz, which corresponds to resonant frequency for a polarizing field of ~8.6 Gauss. The modulation frequency was set as before to ~270 kHz. With the current flowing in the same direction as in a standard Helmholtz coil pair, a relatively homogeneous field is generated across the sample region.

Stepping the current from negative 2.8 A to positive 2.8 A caused $B_0$ to vary between −40 to 40 Gauss and the spectra were obtained within that range.

Figures 10A, 10B:
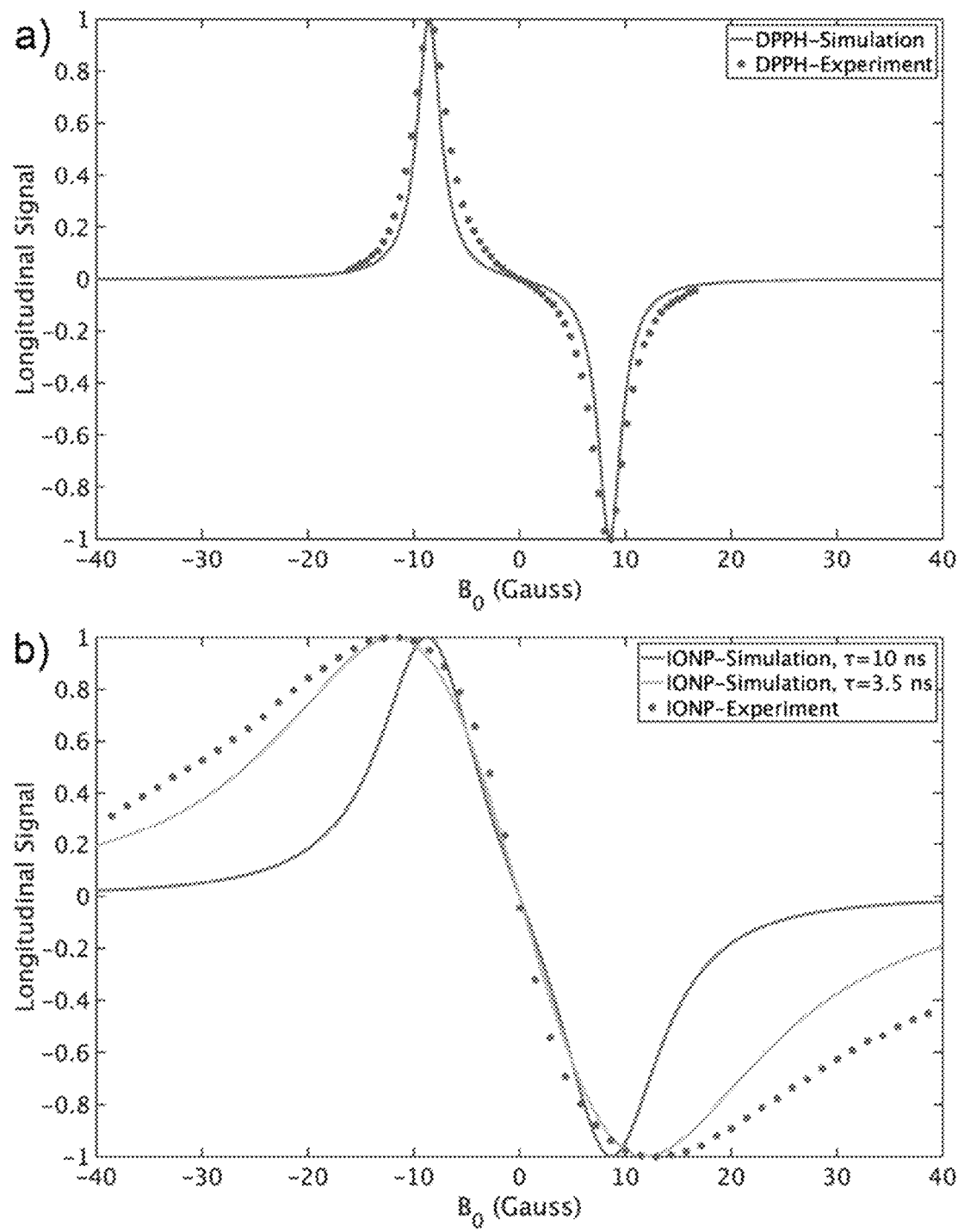
FIGS. 10A and 10B show experimentally acquired spectra of 2,2-diphenyl-1-picrylhydrazyl ("DPPH") (a) and iron-oxide nanoparticles ("IONPs") (b) overlaid by simulation results.

The FFT magnitude of the recorded signal levels versus $B_0$ amplitude for DPPH and IONP, overlaid by the simulations described above, are shown in FIGS. 10A and 10B. A linearly polarized RF field was used in this example study. The leakage caused by the nonlinearity in the circuit appeared to be a first-order baseline after signal averaging and was subtracted from the measured spectra. The measured peak position for DPPH was very close to what was predicted from simulation data in FIG. 5A. As seen in FIG. 10B, the measured IONP spectrum (blue dots) was significantly shifted as compared to the simulation of a spin having a 10 ns relaxation time (red curve). The simulated spectrum of 3.5 ns relaxation time (yellow curve) was a better fit to the experimental data. The RF field strength and carrier frequency were kept the same when measuring the spectra for DPPH and IONP; the peak shift of IONP suggests that the signal caused by the off-resonance counter-rotating RF component may be significant when r is very short.

To evaluate using the systems and methods described in the present disclosure to quantify the concentration of IONP, the 1 mg Fe/mL IONP sample was diluted several times to obtain 0.33 mg Fe/mL, 0.2 mg Fe/mL and 0.03 mg Fe/mL solutions. Spectral measurements were then conducted on the same volume of IONP samples after dilution. The spectral peak amplitude was strongly linearly proportional to the sample concentration.

For 1D imaging, the Z-axis coil pair can be driven separately (as opposed to in series) to create a spatial-encoding gradient with a DC offset along that axis. When acquiring image data, the gradient strength can be fixed, while the DC offset can be varied to produce different on-resonance positions along the Z-axis. Polarity reversing relays can also be used for part of the sweep to avoid negative Z-axis static field and notable Bloch-Siegert effect. In these instances, the gradient is flipped to −20 Gauss/cm from 20 Gauss/cm right after the resonant position passes the middle point of the sample.

For illustration of the process, let the leftmost point of the sample be point A and the rightmost point of the sample be point B. At the beginning of imaging, point A is set to be on resonance ($B_z$=8.5 Gauss) while point B is at 26.5 Gauss, with a gradient of 20 Gauss/cm. At the end of the 1D imaging, point B is set to be on resonance ($B_z$=8.5 Gauss) while point A is at 26.5 Gauss, with a gradient of −20 Gauss/cm. The amplitude of the signal is proportional to the spin density projection at the resonant Z location. Thus, spin density along Z-axis can be measured throughout the sample by repeatedly shifting the offset field.

Figure 11:
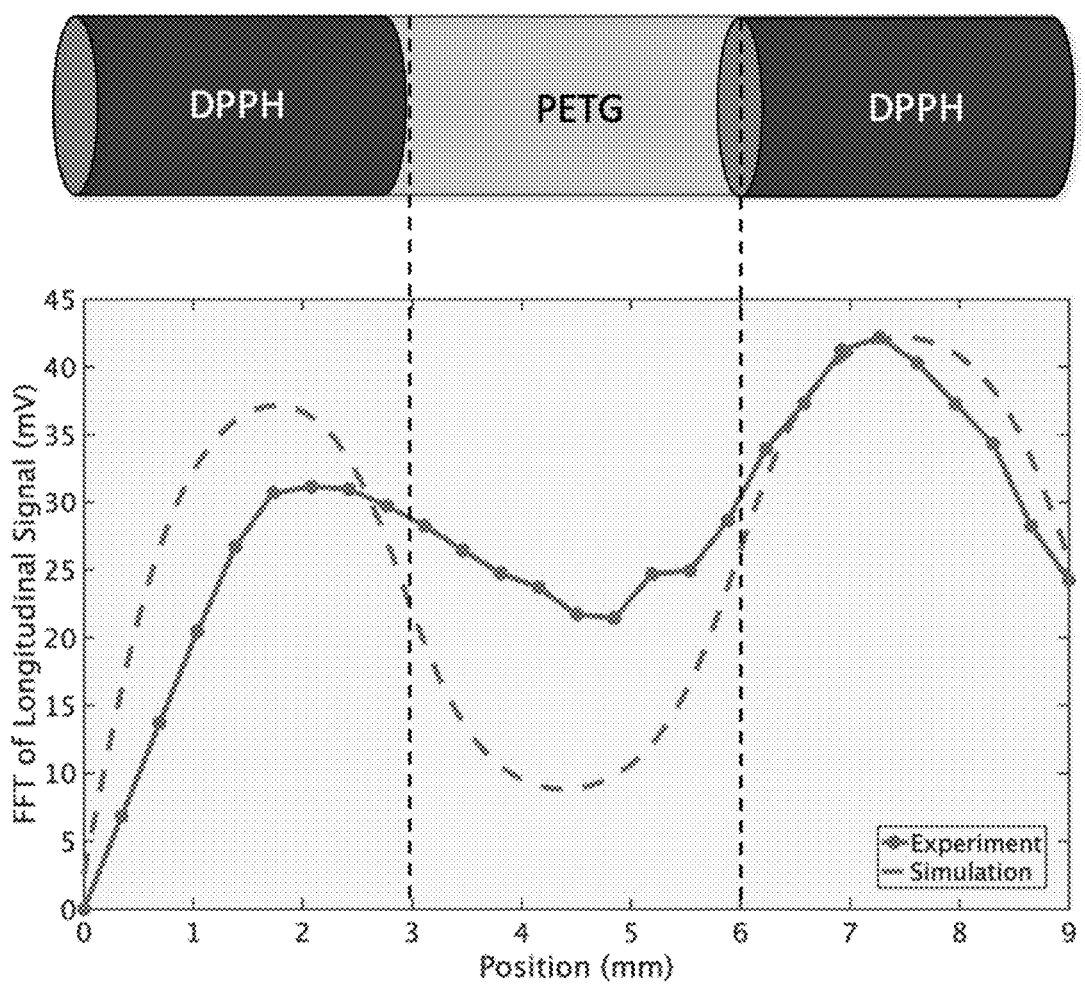
FIG. 11 shows a 1D projection of a DPPH phantom overlaid with rescaled simulation results: a 9-mm long NMR tube containing two 3 mm long DPPH samples, separated by 3 mm long PETG.

Image resolution is influenced by the FWHM of the sample spectral linewidth. As shown in FIGS. 10A and 10B, the FWHM of the DPPH spectrum using a linearly polarized RF field is ~5 Gauss, while that for IONP is ~25 Gauss. Hence, a higher gradient will be used for IONP imaging than for DPPH. The sample used for this example study was a 1 cm long 5 mm NMR tube containing two 3 mm long DPPH samples, separated by 3 mm long polyethylene terephthalate, as shown in FIG. 11. With a gradient strength at 20 Gauss/cm, a 1D projection was acquired at a resolution of ~2.5 mm for DPPH. The baseline tilt of the image may be related to Bloch-Siegert effects. To address this, a quadrature drive with significant fractional bandwidth can be used to further improve image resolution. Alternatively, this distortion can be avoided or otherwise reduced by using RF fields optimized for strong driving fields, such as pulses with Gaussian shape and pulses designed with quantum optimal control theory that explicitly include the Bloch-Siegert shift.

Figure 12:
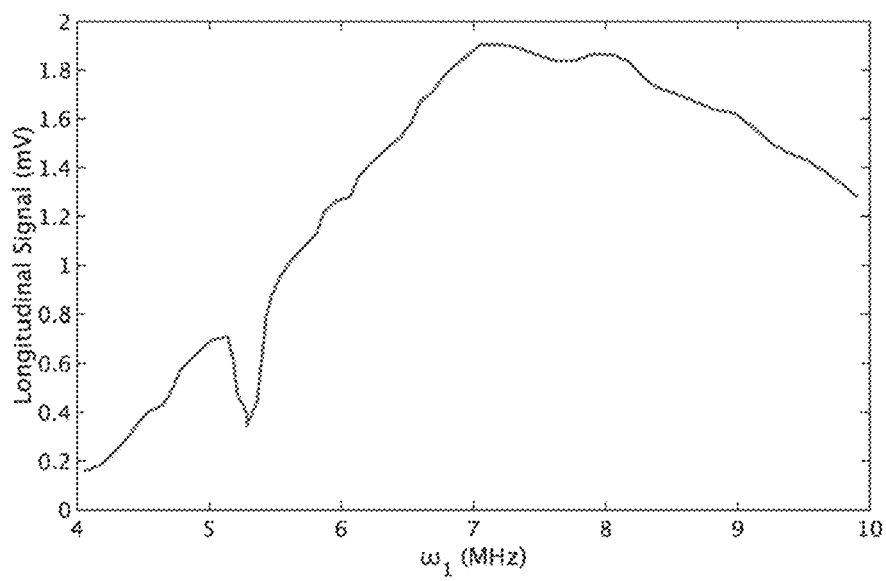
FIG. 12 shows a frequency sweep spectrum of DPPH between 4 and 10 MHz. The noise baseline has been subtracted, and the spectral peak occurs ~7 MHz in this example.

FIG. 12 shows an example frequency sweep DPPH spectrum obtained in an experiment using the system 610 described in the present disclosure using the broadband sweep transmit circuit of FIG. 8 and the corresponding transmit coil configuration described above. The peak of the DPPH spectrum occurs at ~7 MHz. With $B_0$=2 Gauss and $B_1$=0.5 Gauss, the relaxation time of DPPH can be calculated to be ~40 ns using, $$\tau = \sqrt{\frac{1}{\omega_{peak}^2 - \gamma^2(B_0^2 + B_1^2)}}; \tag{23}$$

where $\omega_{peak}$ is the carrier frequency at which the spectral peak occurs.

Compared to conventional magnetic particle imaging, the systems and methods described in the present disclosure can use significantly less gradient strength to achieve comparable resolution.

The effectiveness of using a modulated fictitious field for spin resonance spectroscopy and imaging has been described. For instance, in the steady state or under adiabatic slow passage conditions, the fictitious field gives accurate measurements without the need to do computationally expensive numerical integrations. By defining the fictitious field, a straight-forward approach can be used to visualize and analyze the longitudinal magnetization evolution resulting from an RF field, especially in the low field/zero field range.

The feasibility of performing spectroscopy as well as a 1D imaging with exceptional rejection of the transmit drive while doing simultaneous transmit and receive has been described. As compared with the isolation level typically achieved in CW EPR (e.g., −25 dB), the −80 dB isolation gained from geometrical isolation and frequency separation in the systems described in the present disclosure is a significant improvement. By rotating the direction of a gradient field, 2D and 3D EPR imaging using back-projection reconstruction can be implemented.

With ultra-low frequency and acceptable resolution, the systems and methods described in the present disclosure enable low cost, portable spin resonance (e.g., EPR, NMR) spectroscopy/imaging systems, including for spins with short relaxation times, such as IONPs. One of the common methods for imaging IONPs is magnetic particle imaging ("MPI"). One challenge of MPI is the total frequency overlap between the drive signal and the magnetization, which necessitates the use of harmonics for picking up signal away from the drive frequency. The systems described in the present disclosure address and overcome that problem. Another issue is that the typical MPI spatial encoding gradient is around 500 Gauss/cm. The systems described in the present disclosure can achieve 2D imaging for IONPs with a gradient around 100 Gauss/cm to achieve comparable resolution as MPI. Additional design considerations, such as applying accurate circularly polarized RF fields, using more signal averaging, and more filtering could also be implemented to further increase the SNR and thus the resolution, making it possible to use even smaller gradients for IONP imaging.

In some configurations, an imaging system can be constructed at zero static field with the addition of an RF gradient. In some instances, a frequency-swept RF pulse and/or SQUID can be used to maximize SNR. Using a frequency-swept pulse, magnetization vectors can be inverted even when there is no $B_0$ field. This approach can be useful for increasing SNR in EPR for the case where $B_0=0$. Additionally or alternatively, using frequency-swept pulses can be advantageous for achieving more efficient heating in magnetic fluid or other hyperthermia application, and/or for minimizing heat when recording information on magnetic media.

The systems described in the present disclosure can also be implemented to achieve simultaneous transmit and receive in MRI. For instance, by applying an RF gradient together with an HS pulse, rotary echoes that contain spatially dependent frequency information can be created.

The present disclosure has described one or more preferred embodiments, and it should be appreciated that many equivalents, alternatives, variations, and modifications, aside from those expressly stated, are possible and within the scope of the invention.

The invention claimed is:

1. A method for measuring spin resonance signals generated by a spin isochromat, the method comprising:
    (a) generating a fictitious polarizing field along an axis by transmitting a radio frequency (RF) field in a plane with an RF transmit coil, the fictitious polarizing field having a field strength determined by a carrier frequency and amplitude of the RF field, a relaxation time of the spin isochromat, and a gyromagnetic ratio of the spin isochromat, wherein generating the fictitious polarizing field polarizes the spin isochromat along a direction perpendicular to the plane in which the RF field is transmitted;
    (b) acquiring spin resonance signal data with an RF receive coil by modulating the fictitious field using the RF transmit coil while measuring spin resonance signal generated from a change of longitudinal magnetization of the spin isochromat along the direction perpendicular to the transverse plane.

2. The method of claim 1, wherein modulating the fictitious field comprises turning the fictitious field on and off.

3. The method of claim 2, wherein modulating the fictitious field comprises turning the fictitious field on and off at a modulation frequency that is different from the carrier frequency of the RF field.

4. The method of claim 3, wherein the modulation frequency is different from the frequency of the RF field by at least one order of magnitude.

5. The method of claim 4, wherein the modulation frequency is less than 1 MHz.

6. The method of claim 1, wherein the RF field is a frequency-swept RF field.

7. The method of claim 1, further comprising computing a relaxation time of the spin isochromat from the spin resonance signal data.

8. The method of claim 7, wherein computing the relaxation time of the spin isochromat comprises generating a spectrum from the spin resonance signal data and computing the relaxation time based on a peak of the spectrum.

9. The method of claim 7, wherein the RF field is generated using a broadband frequency sweep.

10. A spin resonance measurement system, comprising:
    a first transmit radio frequency (RF) coil extending in a first direction;
    a second transmit RF coil extending in a second direction that is perpendicular to the first direction;
    a receive RF coil extending in a third direction that is perpendicular to both the first direction and the second direction, wherein the first transmit RF coil and the second transmit RF coil are arranged relative to the receive RF coil such that when operated the first transmit RF coil and second RF transmit coil generate an RF field in a volume measurable by the receive RF coil;
    an RF subsystem in communication with the first transmit RF coil, the second RF transmit coil, and the receive RF coil, and configured to:
        operate the first transmit RF coil and the second transmit RF coil to transmit an RF field in order to generate a fictitious polarizing field in the volume measurable by the receive RF coil, wherein the fictitious polarizing field has a field strength determined by a carrier frequency and amplitude of the RF field, a relaxation time of a selected spin isochromat, and a gyromagnetic ratio of the selected spin isochromat;
        modulate the fictitious field by adjusting at least one of the field strength or the carrier frequency of the RF field;
        detect with the receive RF coil, spin resonance signals generated by the spin isochromat while the fictitious field is being modulated.

11. The spin resonance measurement system of claim 10, further comprising a first gradient coil extending in the third direction and a second gradient coil extending in the third direction, wherein the first gradient coil and the second gradient coil are arranged on opposing sides of the volume measurable by the receive RF coil, wherein the RF subsystem is in communication with the first gradient coil and the second gradient coil and configured to operate the first gradient coil and the second gradient coil to generate a spatial-encoding gradient in the fictitious field.

12. The spin resonance measurement system of claim 11, wherein the RF subsystem is configured to separately drive the first gradient coil and the second gradient coil to generate the spatial-encoding gradient in the fictitious field with a direct current (DC) offset along a longitudinal axis that is perpendicular to a transverse plane, wherein the transverse plane is parallel to the third direction.

13. The spin resonance measurement system of claim 12, wherein the RF subsystem is configured to vary the DC offset to produce different on-resonance positions along the longitudinal axis.

14. The spin resonance measurement system of claim 10, wherein the first transmit RF coil and the second transmit RF coil comprise a pair of quadrature Helmholtz coils.

15. The spin resonance measurement system of claim 14, wherein the RF subsystem is configured to operate the first transmit RF coil and the second transmit RF coil to generate a circularly polarized RF field.

16. The spin resonance measurement system of claim 14, wherein the RF subsystem is configured to operate the first transmit RF coil and the second transmit RF coil to generate a linearly polarized RF field.

17. The spin resonance measurement system of claim 10, wherein the first transmit RF coil and the second transmit RF coil comprise U-shaped conductive elements.

18. The spin resonance measurement system of claim 10, wherein the RF subsystem comprises a transmit circuit in communication with the first and second transmit RF coils and configured to operate at least one of the first and second transmit RF coils using a broadband sweep of the carrier frequency.

* * * * *